(12) United States Patent
Yomori et al.

(10) Patent No.: US 12,072,624 B2
(45) Date of Patent: Aug. 27, 2024

(54) METHOD FOR FORMING COLOR FILTER ARRAY AND METHOD FOR MANUFACTURING ELECTRONIC DEVICE

(71) Applicant: CANON KABUSHIKI KAISHA, Tokyo (JP)

(72) Inventors: Mitsuhiro Yomori, Kawasaki (JP); Yuto Nozaki, Yokohama (JP); Mariko Furuta, Yokohama (JP); Kiyoto Murakumo, Tachikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/191,405

(22) Filed: Mar. 3, 2021

(65) Prior Publication Data

US 2021/0191260 A1 Jun. 24, 2021

Related U.S. Application Data

(63) Continuation of application No. 15/684,682, filed on Aug. 23, 2017, now Pat. No. 10,969,681.

(30) Foreign Application Priority Data

Aug. 29, 2016 (JP) .................................. 2016-167345
Apr. 27, 2017 (JP) .................................. 2017-088511

(51) Int. Cl.
 *G03F 7/00* (2006.01)
 *G02B 5/20* (2006.01)
 *G02F 1/1335* (2006.01)

(52) U.S. Cl.
 CPC ........... *G03F 7/0007* (2013.01); *G02B 5/201* (2013.01); *G02F 1/133514* (2013.01);
(Continued)

(58) Field of Classification Search
 CPC ......... G02F 1/133514; G02F 1/136286; G03F 7/0007; H01L 2251/5338
 See application file for complete search history.

(56) References Cited

U.S. PATENT DOCUMENTS

2005/0253984 A1* 11/2005 Kim ...................... G02F 1/1362
 349/106
2006/0226342 A1* 10/2006 Sato ..................... H04N 25/134
 348/E9.01
(Continued)

FOREIGN PATENT DOCUMENTS

JP 2016-051060 A 4/2016

*Primary Examiner* — Jonathan Y Jung
(74) *Attorney, Agent, or Firm* — Canon U.S.A., Inc. I.P. Division

(57) ABSTRACT

A display device includes a light emitting layer and color filter arrays. The color filter arrays comprise a first color filter array of a first color, and a second color filter array of a second color. The first color filter array comprises a first pair of color filters adjacent to each other with a first clearance therebetween and a second pair of color filters adjacent to each other with a second clearance therebetween. The second color filter array comprises a first color filter positioned between the first pair of color filters and a second color filter positioned between the second pair of color filters. A width of the first clearance is larger than a width of the second clearance. A width of the first color filter is larger than a width of the second color filter. The second color filter partially overlaps with the second pair of color filters.

23 Claims, 20 Drawing Sheets

(52) U.S. Cl.
CPC ............ *G03F 7/001* (2013.01); *G03F 7/0012* (2013.01); *G02F 1/133516* (2013.01)

(56) References Cited

U.S. PATENT DOCUMENTS

| | | | |
|---|---|---|---|
| 2015/0236045 A1* | 8/2015 | Im | G02F 1/1368 257/72 |
| 2015/0236074 A1* | 8/2015 | Akagawa | G02B 5/201 257/40 |
| 2015/0362796 A1* | 12/2015 | Kong | G02F 1/133512 349/110 |
| 2016/0033815 A1* | 2/2016 | Lee | H10K 59/8792 257/40 |
| 2016/0145138 A1* | 5/2016 | Lee | C03C 23/007 65/106 |
| 2016/0204185 A1* | 7/2016 | Iijima | H10K 59/873 257/91 |
| 2016/0274428 A1* | 9/2016 | Kim | H01L 27/124 |
| 2018/0188869 A1* | 7/2018 | Boggs | B60K 35/00 |

* cited by examiner

METHOD FOR FORMING COLOR FILTER ARRAY AND METHOD FOR MANUFACTURING ELECTRONIC DEVICE

This application is a continuation of U.S. application Ser. No. 15/684,682 filed Aug. 23, 2017, which claims the benefit of Japanese Patent Application No. 2016-167345 filed Aug. 29, 2016, and No. 2017-088511 filed Apr. 27, 2017, which are hereby incorporated by reference herein in their entirety.

BACKGROUND OF THE INVENTION

Field of the Invention

The present disclosure relates to a color filter array.

Description of the Related Art

Electronic devices, such as an image capturing device and a display device, employ a color filter array in which color filters of multiple colors are arranged. The color filter array including color filters of multiple colors is hereinafter referred to as a multi-color filter array and is abbreviated as MCFA. The use of MCFA allows a color image to be captured or displayed.

Japanese Patent Laid-Open No. 2009-43899 discloses a solid-state image capturing apparatus in which the colors of color filter elements are arranged in Bayer pattern.

One of the problems of the MCFA is color shading. Color shading is color unevenness caused by difference in white balance from area to area in the image.

SUMMARY OF THE INVENTION

The present disclosure provides a technique useful in reducing color shading.

A first aspect of the present disclosure is a method for forming a color filter array. The method includes the step of forming a first color filter array by forming a first color filter film on a surface of a base member using a coating method and by patterning the first color filter film and the step of forming a second color filter array by forming a second color filter film on the surface so as to cover the first color filter array using a coating method and by patterning the second color filter film. The first color filter array includes a first pair of color filters adjacent to each other in a predetermined direction with a first clearance therebetween and a second pair of color filters adjacent to each other in the predetermined direction with a second clearance therebetween. The second color filter array includes a first color filter positioned between the first pair of color filters and a second color filter positioned between the second pair of color filters. A width of the first clearance in the predetermined direction is larger than a width of the second clearance in the predetermined direction. Each of the first color filter and the second color filter has a lower surface which is a surface adjacent to the base member and an upper surface which is a surface opposite to the lower surface. A distance from a reference plane extending along the surface to the upper surface of the first color filter and a distance from the reference plane to the upper surface of the second color filter differ from each other.

A second aspect of the present disclosure is a method for forming a color filter array. The method includes the step of forming a first color filter array by forming a first color filter film on a surface of a base member using a coating method and by patterning the first color filter film and the step of forming a second color filter array by forming a second color filter film on the surface so as to cover the first color filter array using the coating method and by patterning the second color filter film. The first color filter array includes a first color filter and a second color filter each constituting a pixel. The second color filter array includes a third color filter positioned between the first color filter and the second color filter. A width of the first color filter and a width of the second color filter differ from each other in at least one of a first direction in which the first color filter and the second color filter are arranged and a second direction perpendicular to the first direction.

A third aspect of the present disclosure is a method for forming a color filter array. The method includes the step of forming a first color filter array by forming a first color filter film on a surface of a base member using a coating method and by patterning the first color filter film and the step of forming a second color filter array by forming a second color filter film on the surface so as to cover the first color filter array using the coating method and by patterning the second color filter film. The first color filter array includes a first color filter and a second color filter each constituting a pixel. The second color filter array includes a third color filter positioned between the first color filter and the second color filter. The patterning of the first color filter film is performed by photolithography using a photomask. The photomask includes a first opening for exposing a portion of the first color filter film to be the first color filter and a second opening for exposing a portion of the first color filter film to be the second color filter. The first opening and the second opening have different widths in a direction in which the first opening and the second opening are arranged.

Further features of the present disclosure will become apparent from the following description of exemplary embodiments with reference to the attached drawings.

DESCRIPTION OF THE EMBODIMENTS

Embodiments of the present disclosure will be described hereinbelow with reference to the drawings. In the following descriptions and drawings, common configurations among the plurality of drawings are given the same reference signs. For that reason, the common configurations will be described with reference to the drawings, and descriptions of the configurations given the same reference signs will be omitted as appropriate.

Figure 1A:
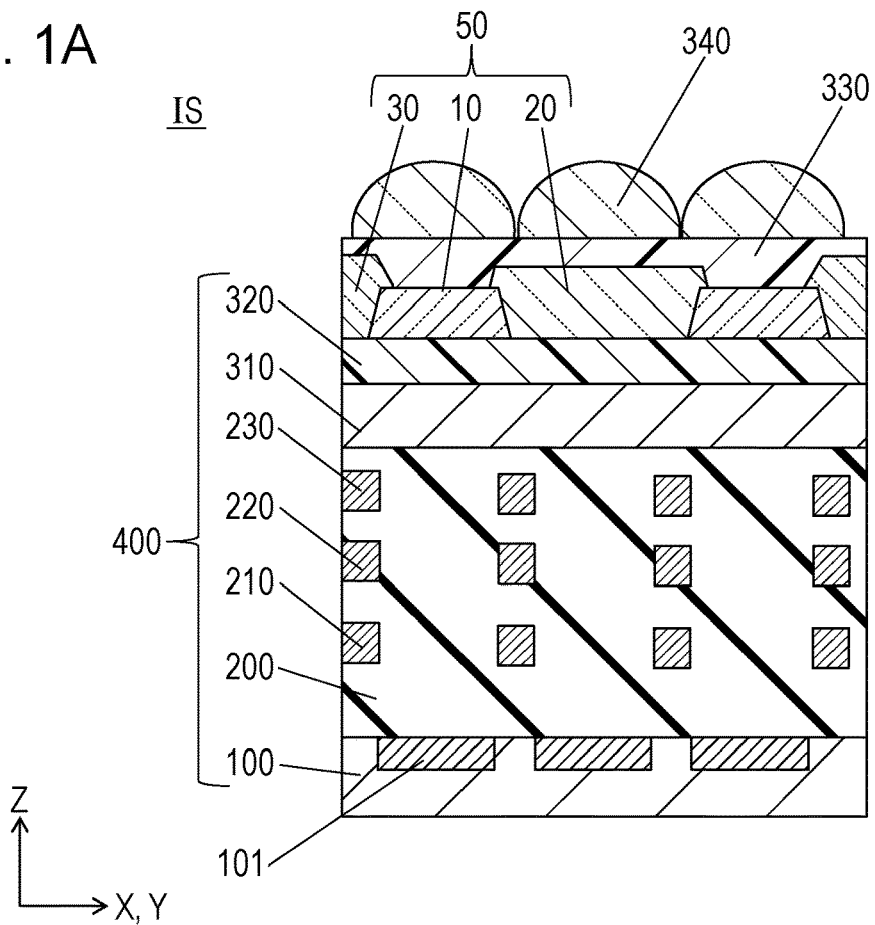
FIG. 1A is a cross-sectional view of an electronic device (an image capturing device).
Figure 1B:
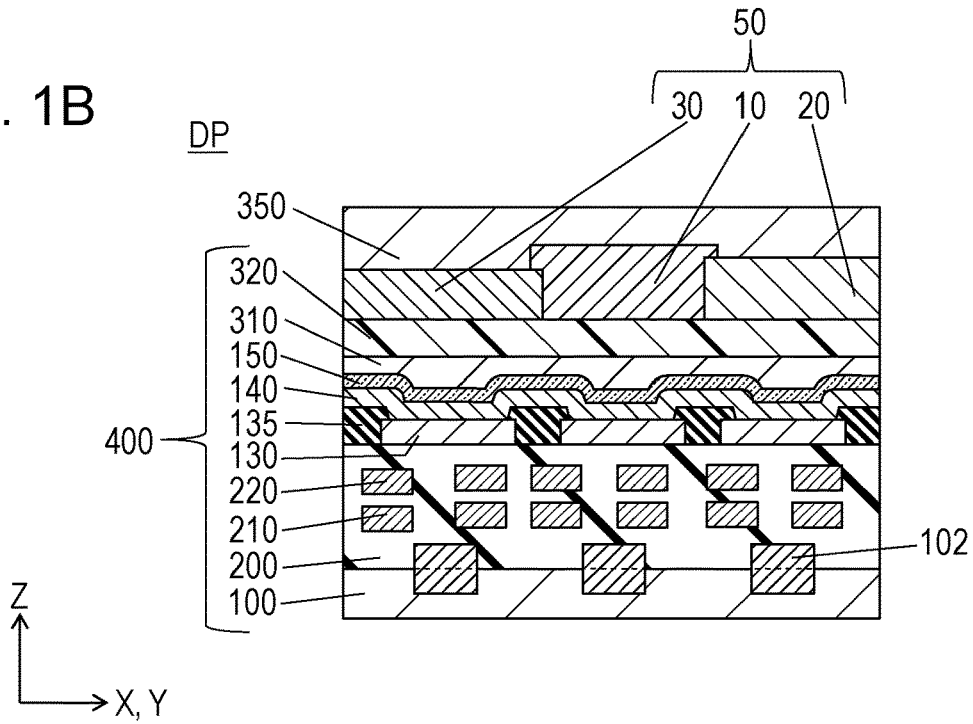
FIG. 1B is a cross-sectional view of an electronic device (a display device).

FIG. 1A illustrates an image capturing device IS, and FIG. 1B illustrates a display device DP as examples of an electronic device including a multi-color filter array. A MCFA 50 is disposed on a base member 400.

Referring to FIG. 1A, the structure of the image capturing device IS, which is an example of the electronic device, will be described. The base member 400 includes a semiconductor substrate 100 including photoelectric conversion units 101, such as photodiodes, and a multilayer wiring structure on the semiconductor substrate 100. The multilayer wiring structure includes wiring layers 210, 220, and 230 layered with an interlayer insulating film 200 therebetween. A passivation film 310 and a planarizing film 320 are disposed on the multilayer wiring structure. In the present embodiment, the wiring layers 210, 220, and 230 are made of aluminum wiring lines, and the interlayer insulating film 200 are made of silicon oxide film. The passivation film 310 on the wiring layers 210, 220, and 230 has a three layer structure of silicon oxynitride (SiON), silicon nitride (SiN), and SiON. The MCFA 50 is disposed on the planarizing film 320. A microlens array 340 is disposed on the MCFA 50, with a planarizing film 330 therebetween.

Referring to FIG. 1B, the structure of the display device DP, which is an example of the electronic device, will be described. A base member 400 includes a semiconductor substrate 100 including transistors 102 and a multilayer wiring structure on the semiconductor substrate 100. The multilayer wiring structure includes wiring layers 210 and 220 layered with an interlayer insulating film 200 therebetween. A plurality of pixel electrodes 130 and a counter electrode 150 that faces the pixel electrodes 130 are disposed on the multilayer wiring structure. The pixel electrodes 130 function as one of a positive electrode and an opposing electrode. The counter electrode 150 functions as the other of the positive electrode and the opposing electrode. A light emitting layer 140 made of an organic semiconductor material is disposed between the pixel electrodes 130 and the counter electrode 150. An insulating member 135 for separation is disposed between the pixel electrode 130. The counter electrode 150 can be a transparent conductive film. A passivation film 310 and a planarizing film 320 are disposed on the counter electrode 150. The MCFA 50 is disposed on the planarizing film 320. A protective film 350 is disposed on the MCFA 50.

An image capturing apparatus including the image capturing device and a display unit including the display device can further include a container (package) for housing the electronic device. The package can include a cover facing the electronic device and a connecting member for transmitting and receiving signals between the electronic device and an external device.

The image capturing apparatus can constitute an imaging system. The imaging system is an information terminal including a camera or an image capturing function. The imaging system can include a signal processing unit that processes signals acquired from the image capturing apparatus and a display unit that displays images captured by the image capturing apparatus.

The display unit can constitute a display system. The display system is an information terminal including a display or a display function. The display system can include a signal processing unit that processes signals input to the display unit and an image capturing apparatus that acquires an image to be displayed on the display unit.

Regarding first to fifth embodiments of the present disclosure, common matter of the first to fifth embodiments will be first described.

Common Matter of First to Fifth Embodiments

Figure 2A:
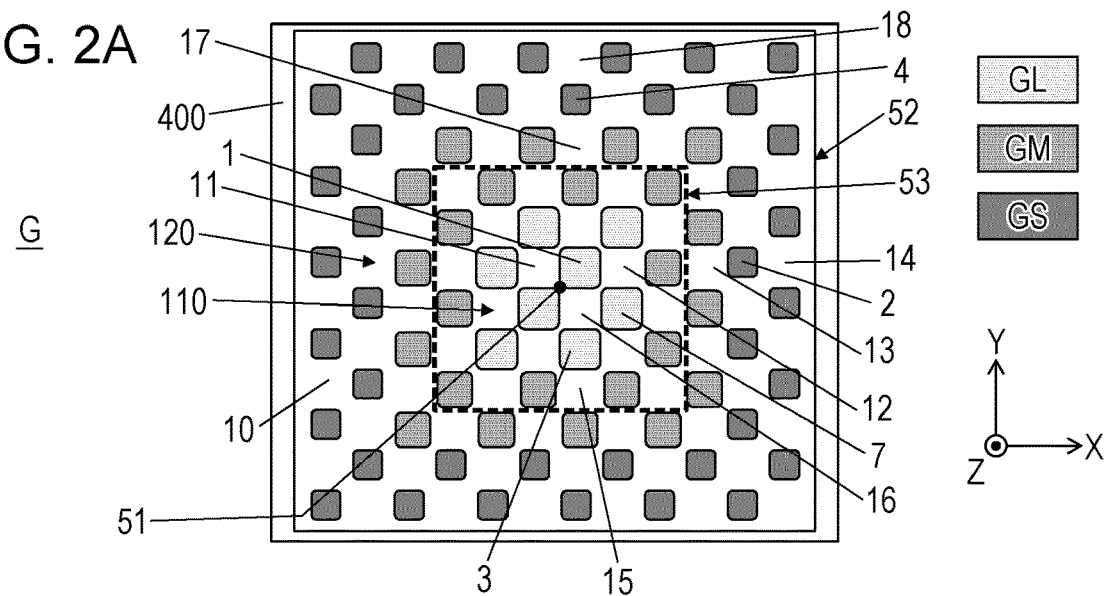
FIGS. 2A to 2C are schematic plan views of an MCFA illustrating a method for forming the MCFA according to an embodiment of the present disclosure.
Figure 2B:
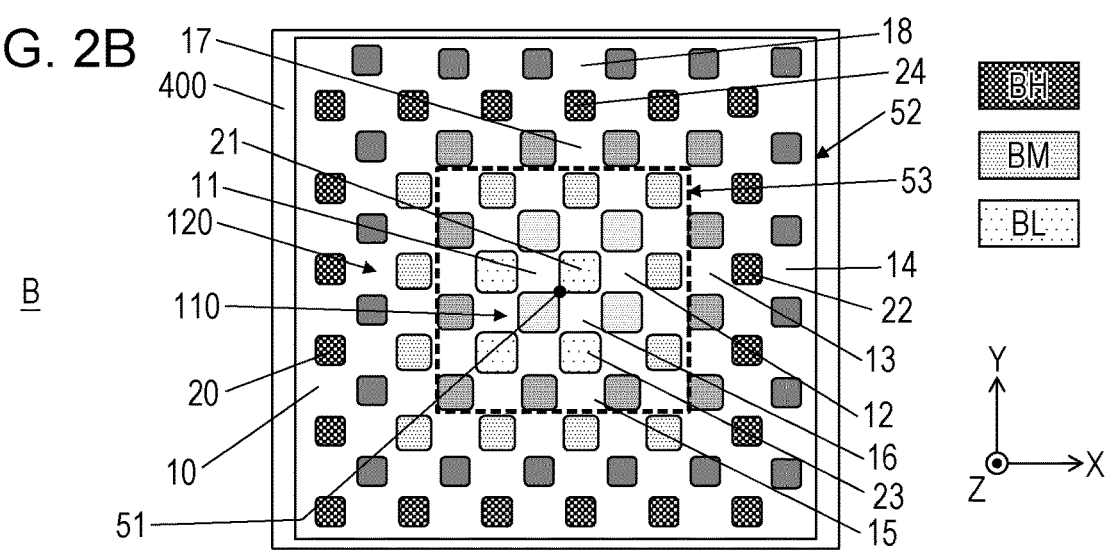
Figure 2C:
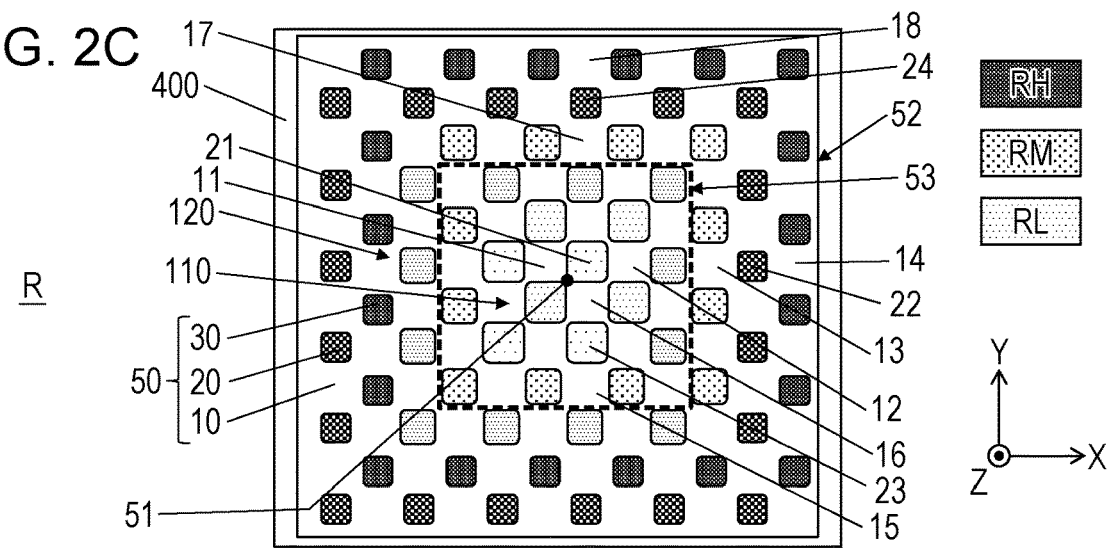

Referring to FIGS. 2A to 2C, the configuration of the MCFA 50 and a method for forming the MCFA 50 will be described. FIG. 2C is a plan view of the MCFA 50. FIGS. 2A and 2B illustrate states in the process of forming the MCFA 50 into the state illustrated in FIG. 2C.

The MCFA 50 is constituted by color filter arrays of multiple colors including a color filter array 10, a color filter array 20, and a color filter array 30. An area where the MCFA 50 is disposed serves as an image capturing area in an image capturing device and a display area in a display device. The color filter arrays 10, 20, and 30 of individual colors each include a plurality of color filters arranged in a one-dimensional pattern or a two-dimensional pattern in the placement area. Each of the plurality of color filters in each color filter array corresponds to one pixel. The plurality of color filters constituting the color filter arrays 10, 20, and 30 are discontinuously disposed in a certain direction. However, the plurality of color filters constituting the color filter arrays 10, 20, and 30 may be disposed partially continuously at the corners and so on. Arrangement by color may be of a honeycomb type or a stripe type, in addition to the Bayer type of the present embodiment.

The color filter arrays 10, 20, and 30 have different main wavelengths at which visible light is passed through (wavelengths at which the transmittance of visible light is maximum) for each color. For example, the color filter array 10 is formed of color filters (green filters) that mainly transmit green (G). The color filter array 20 is formed of color filters (blue filters) that mainly transmit blue (B). The color filter array 30 is formed of color filters (red filters) that mainly transmit red (R). The MCFA 50 can be formed by combining the color filter arrays 10, 20, and 30. The combination of colors is not limited to the RGB system but may be a CMY system or a combination thereof. The MCFA 50 may be configured to partially transmit white light (W). In the present embodiment, the color filter array 10 has its main wavelength in a green wavelength range, the color filter array 20 in a blue wavelength range, and the color filter array 30 in a red wavelength range.

As illustrated in FIGS. 2A to 2C, the MCFA 50 includes a central portion 110 and a peripheral portion 120. In the placement area of the MCFA 50, a boundary 53 between the central portion 110 and the peripheral portion 120 is set between a center 51 and an edge 52 of the MCFA 50, and the inside of the boundary 53 (near to the center 51) is the central portion 110, and the outside of the boundary 53 (near to the edge 52) is the peripheral portion 120. The boundary 53 can be set at an equal distance from the center 51 and the edge 52. In other words, points on the boundary 53 are positioned at midpoints between points on the edge 52 and the center 51.

FIGS. 3A to 3C and FIGS. 4A to 4C are cross-sectional views of part of the central portion 110 and the peripheral portion 120 in the individual steps in the method of manufacturing an electronic device including forming the MCFA 50.

FIG. 2A illustrates a process G of forming the color filter array 10. FIGS. 3A, 3B, and 3C and FIG. 4A illustrate cross sections of individual steps included in the process G.

Figure 3A:
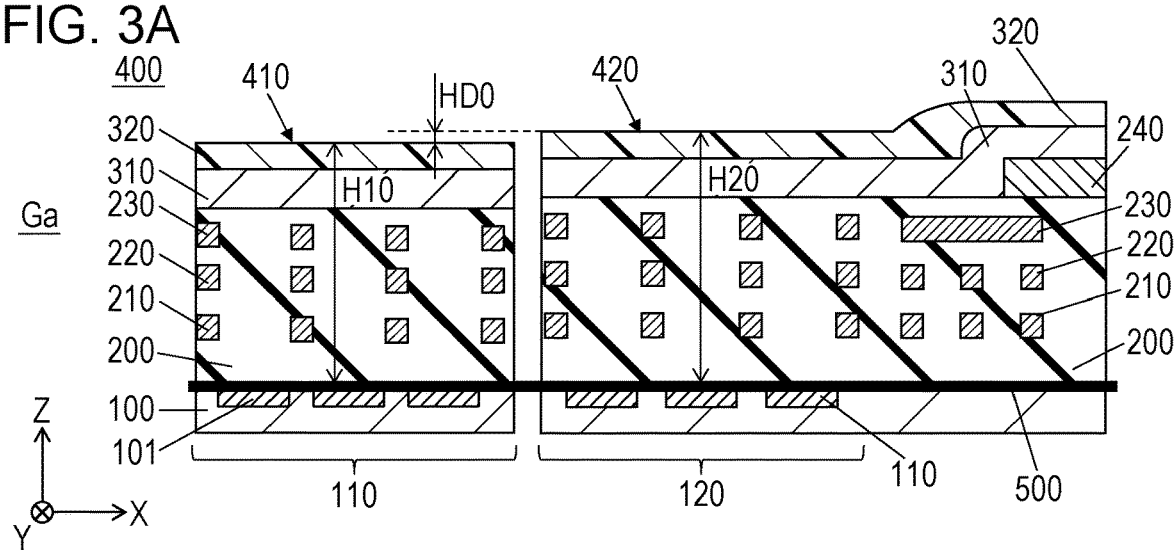
FIGS. 3A to 3C are schematic cross-sectional views of an MCFA illustrating the method for forming the MCFA according to the embodiment.

At step Ga illustrated in FIG. 3A, the base member 400 formed by an appropriate semiconductor process or the like is arranged. The base member 400 has a surface extending in an X-direction and in a Y-direction crossing (perpendicular to) the X-direction. Thickness and height indicate a position in a Z-direction crossing (perpendicular to) the X-direction and the Y-direction. In the following description, the surface will be described separately for a surface 410 in the central portion 110 and a surface 420 in the peripheral portion 120.

FIG. 3A illustrates, for the surface of the base member 400, the height H10 of the surface 410 in the central portion 110, and the height H20 of the surface 420 in the peripheral portion 120. The height of a predetermined surface is a distance from a reference plane 500 to the predetermined surface. The reference plane 500 is a flat surface parallel to the X-direction and the Y-direction. Although the position of the reference plane 500 in the Z-direction is an any position, the surface of the semiconductor substrate 100 is set as the reference plane 500 in the present embodiment. FIG. 3A illustrates the difference between the height H10 and the height H20, that is, the difference in height, HD0, (HD0=|H10−H20|) between the surface 410 and the surface 420.

Figure 3B:
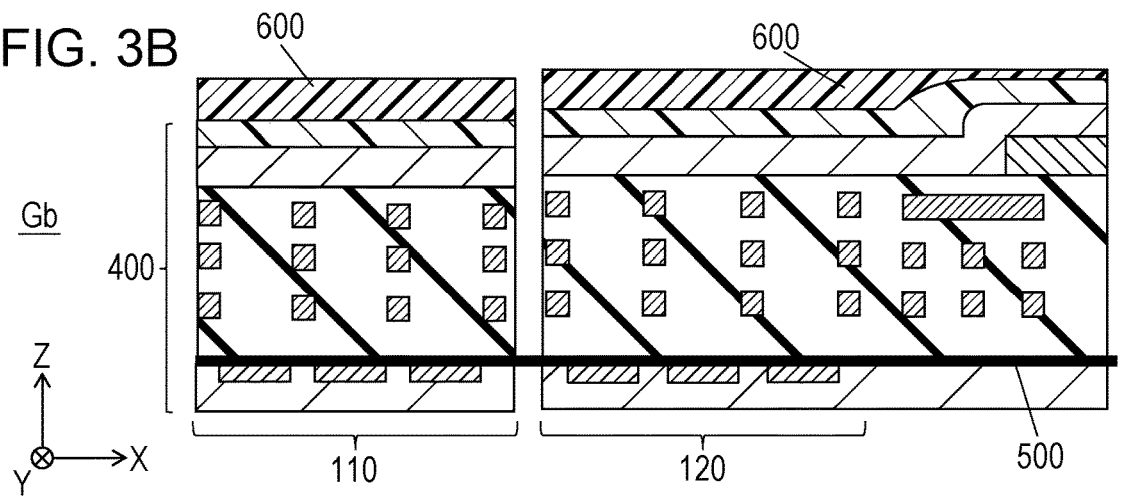
Figure 3C:
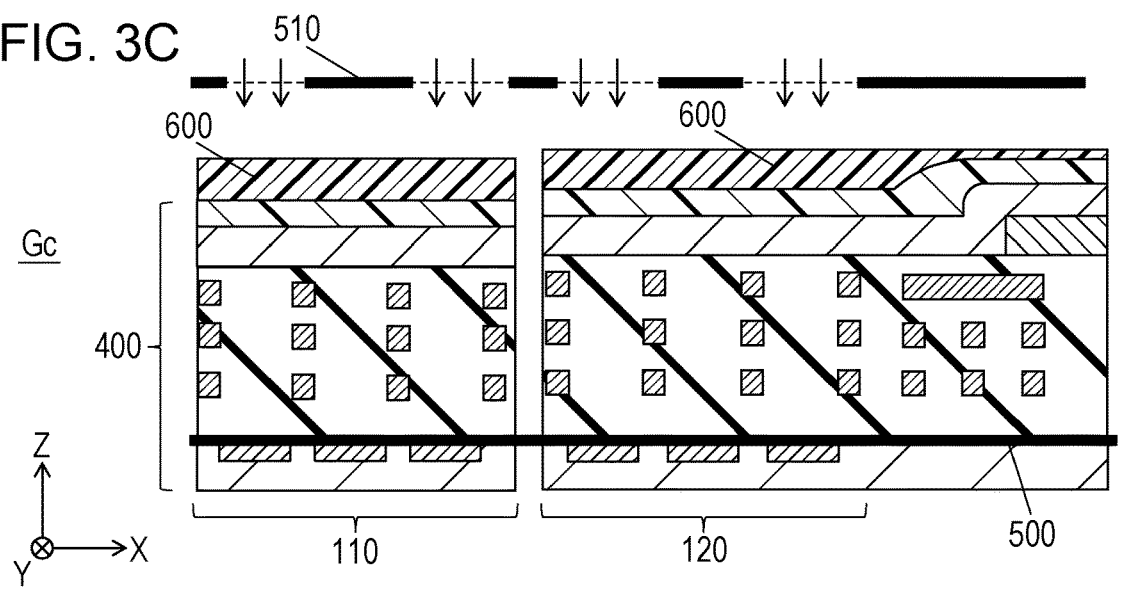

At step Gb illustrated in FIG. 3B, a color filter film 600 is formed on the base member 400 using a coating method. The thickness of the color filter film 600 is preferably about 500 nm to 1,000 nm. A typical example of the coating method is a spin coating method, but a dipping method or a spray method may be used. The viscosity of a liquid composition used as the material of the color filter film 600 applied to the base member 400 is preferably 1 mPa·S to 20 mPa·S. The rotational speed in the application in the spin coating method is preferably from 300 rpm to 2,500 rpm.

Next, the color filter film 600 is patterned by photolithography (exposure and development). At step Gc in FIG. 3C, the color filter film 600 is exposed to light using an appropriate photomask 510. Although the color filter film 600 of the present embodiment is a negative-type photosensitive resin, the color filter film 600 may be a positive-type photosensitive resin.

Figure 4A:
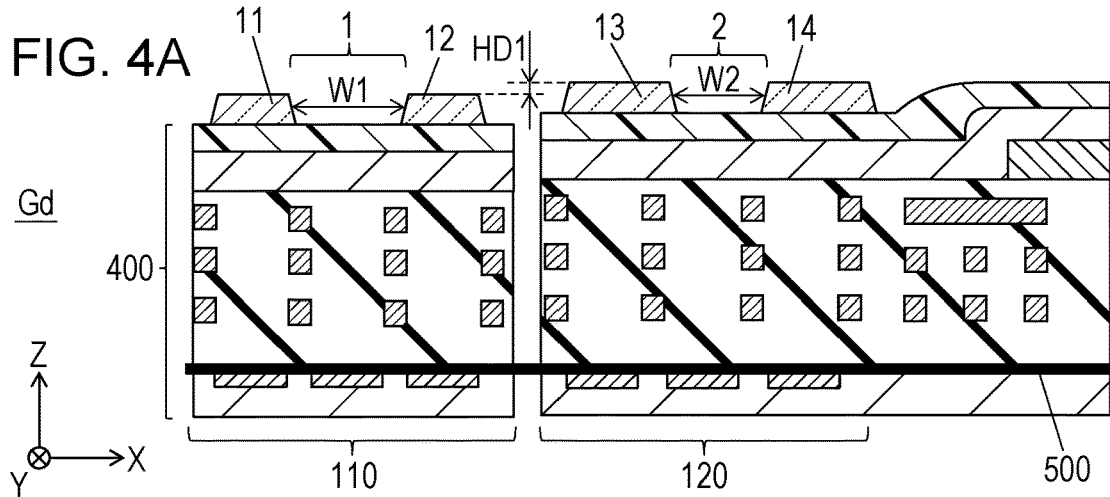
FIGS. 4A to 4C are schematic cross-sectional views of the MCFA illustrating the method for forming the MCFA according to the embodiment.

At step Gd illustrated in FIG. 4A, the exposed color filter film 600 is developed. The exposed part of the color filter film 600, which is a negative-type photosensitive resin, remains after the development. The part of the color filter film 600 remaining after the patterning forms the color filter array 10.

As illustrated in FIGS. 2A and 4A, the color filter array 10 includes a pair of color filters 11 and 12 next to each other in the X-direction, with a clearance 1 therebetween. The color filter array 10 further includes a pair of color filters 13 and 14 next to each other in the X-direction, with a clearance 2 therebetween. The clearance may be expressed, in other words, as a gap. FIG. 4A illustrates a width W1 of the clearance 1 in the X-direction and a width W2 of the clearance 2 in the X-direction.

The respective widths W1 and W2 of the clearances 1 and 2 may be measured at a height at which a middle plane at an equal distance from the upper surface and the lower surface of the color filters 11 and 12 or the color filters 13 and 14 is positioned. The widths W1 and W2 of the clearances 1 and 2 may also be measured at a height at which the upper surfaces or the lower surfaces of the color filters 11 and 12 or the color filters 13 and 14 are positioned. However, width measurement errors due to residue of the color filters, an abnormal shape of the end, and so on can be more reduced when the widths W1 and W2 are measured at the height at which the middle plane is positioned than at the height of the upper surfaces or the height of the lower surfaces. As illustrated in FIG. 2A, the color filter array 10 further includes a pair of color filters 15 and 16 next to each other in the Y-direction, with a clearance 3 therebetween. The color filter array 10 further includes a pair of color filters 17 and 18 in the Y-direction, with a clearance 4 therebetween. A width W3 of the clearance 3 in the Y-direction and a width W4 of the clearance 4 in the Y-direction are not shown.

The widths of the clearances 1 to 4 are compared in the same direction (for example, the X-direction or the Y-direction). For example, a comparison between the width of the clearance 1 in the X-direction and the width of the clearance 2 in the Y-direction does not make sense. The width W1 of the clearance 1 can be controlled by adjusting the line widths of the color filters 11 and 12 positioned on both sides of the clearance 1, and the width W2 of the clearance 2 can be controlled by adjusting the line widths of the color filters 13 and 14 positioned on both sides of the clearance 2. The width W1 of 99% or less or 101% or higher of the width W2 is suitable in making the width W1 and the width W2 differ in all embodiments of the present disclosure. In contrast, when the width W1 is at least 99.9% or higher and 100.1% or less of the width W2, the width W1 and the width W2 can be considered to be the same. In all embodiments of the present disclosure, the width W1 is preferably 90% or higher and 110% or less of the width W2, and more preferably, the width W1 is 95% or higher and 105% or less of the width W2. This is because an extreme difference between the width W1 and the width W2 can cause a difference in sensitivity and a difference in luminance due to a difference in pixel size. The difference between the width W1 and the width W2 is set smaller than the line width of a wiring layer 230, which is the uppermost wiring layer under the MCFA 50. Even if the width W1 and the width W2 differ, when the difference is less than the line width of the uppermost wiring layer, the influence of the sensitivity difference and the luminance difference due to a difference in pixel size can be minimized. The clearances between color filters and the widths of the color filters on both sides of each clearance can be adjusted by appropriately designing the mask pattern of the photomask 510 according to the target widths of the clearances.

In FIG. 2A, the widths of the clearances in the color filter array 10 in the X-direction and the Y-direction are classified into three kinds and indicated by hatching. A clearance GL of a first kind is larger in width than a clearance GS of a second kind. A clearance GM of a third kind has a width between the width of the clearance GL of the first kind and the width of the clearance GS of the second kind. The clearance 1 is classified as the clearance GL of the first kind, and the clearance 2 is classified as the clearance GS of the second kind. The clearance GM of the third kind is positioned in the vicinity of the boundary 53.

Figure 4B:
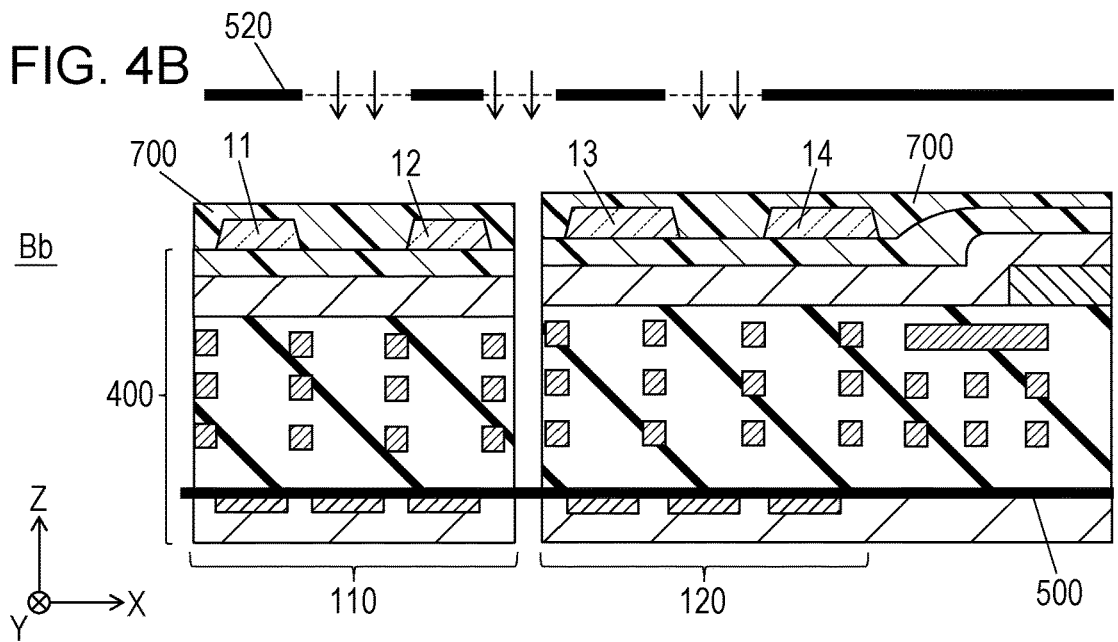
Figure 4C:
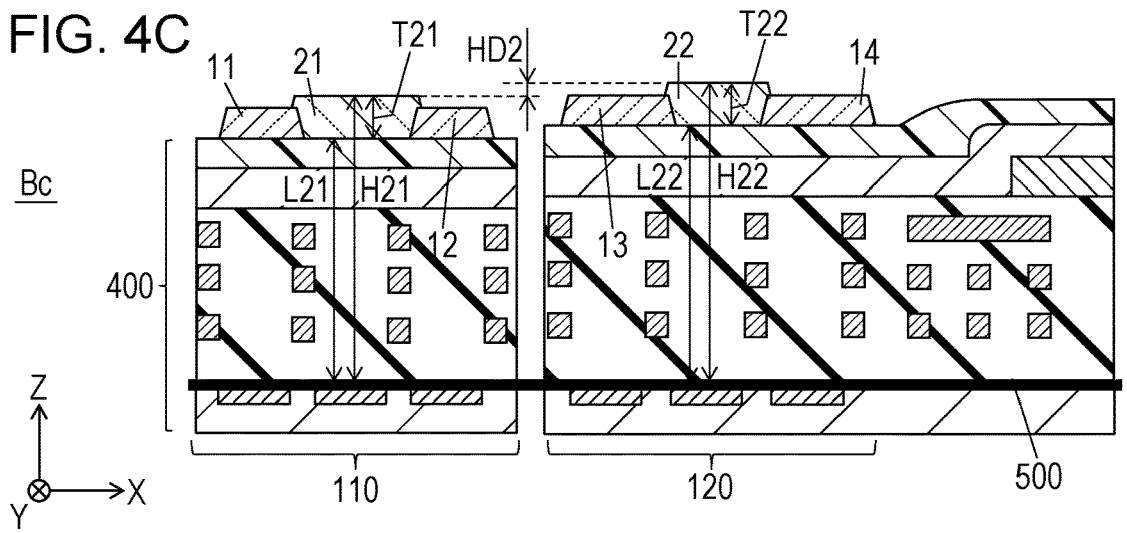

FIG. 2B illustrates a process B of forming the color filter array 20. FIGS. 4B and 4C illustrate cross sections of the individual steps of the process B.

At step Bb illustrated in FIG. 4B, a color filter film 700 is formed on the base member 400 so as to cover the color filter array 10 using a coating method. The thickness of the color filter film 700 is preferably about 500 nm to 1,000 nm. A typical example of the coating method is a spin coating method, but a dipping method or a spray method may be used. The viscosity of a liquid composition used as the material of the color filter film 700 applied to the base member 400 is preferably 1 mPa·S to 20 mPa·S. The rotational speed in the application in the spin coating method is preferably from 300 rpm to 2,500 rpm.

Next, the color filter film 700 is patterned by photolithography (exposure and development). At step Bb in FIG. 4B, the color filter film 700 is exposed to light using an appropriate photomask 520. Although the color filter film 700 of the present embodiment is a negative-type photosensitive resin, the color filter film 700 may be a positive-type photosensitive resin.

At step Bc illustrated in FIG. 4C, the exposed color filter film 700 is developed. The exposed part of the color filter film 700, which is a negative-type photosensitive resin, remains after the development. The part of the color filter film 700 remaining after the patterning forms the color filter array 20.

The color filter array 20 includes a color filter 21 positioned between the pair of color filters 11 and 12. The color filter array 20 further includes a color filter 22 positioned between the pair of color filters 13 and 14. The color filter 21 is disposed in the clearance 1 illustrated in FIGS. 2A and 4A, and the color filter 22 is disposed in the clearance 2 illustrated in FIGS. 2A and 4A. In the X-direction, the color filter 21 has a width corresponding to the width W1 of the clearance 1, and the color filter 22 has a width corresponding to the width W2 of the clearance 2. As illustrated in FIGS. 2B and 2C, the color filter array 20 further includes a color filter 23 positioned between the pair of color filters 15 and 16. The color filter array 20 further includes a color filter 24 positioned between the pair of color filters 17 and 18. The color filter 23 is disposed in the clearance 3 illustrated in FIG. 2A, and the color filter 24 is disposed in the clearance 4 illustrated in FIG. 2A. In the Y-direction, the color filter 23 has a width corresponding to the width W3 of the clearance 3, and the color filter 24 has a width corresponding to the width W4 of the clearance 4. Each of the color filter 21 and the color filter 22 has a lower surface, which is a surface adjacent to the base member 400, and an upper surface, which is a surface opposite to the lower surface.

The height H21 of the upper surface of the color filter 21 is a distance from the reference plane 500 to the upper surface of the color filter 21. Likewise, the height H22 of the upper surface of the color filter 22 is a distance from the reference plane 500 to the upper surface of the color filter 22. The height L21 of the lower surface of the color filter 21 is a distance from the reference plane 500 to the lower surface of the color filter 21. Likewise, the height L22 of the lower surface of the color filter 22 is a distance from the reference plane 500 to the lower surface of the color filter 22.

The thickness T21 of the color filter 21 corresponds to the distance between the upper surface and the lower surface of the color filter 21 and corresponds to the difference ($T21=H21-L21$) between the height H21 and the height L21. Likewise, the thickness T22 of the color filter 22 corresponds to the distance between the upper surface and the lower surface of the color filter 22 and corresponds to the difference ($T22=H22-L22$) between the height H22 and the height L22.

In FIG. 2B, the heights of the upper surfaces of the color filters (second-color filters) of the color filter array 20 are classified into three kinds and indicated by hatching. The height of the upper surface of a second-color filter BL of a first kind is smaller than the height of the upper surface of a second-color filter BH of a second kind. The upper surface of a second-color filter BM of a third kind has a height between the height of the upper surface of the second-color filter BL of the first kind and the height of the upper surface of the second-color filter BL of the second kind. The second-color filter BM of the third kind is positioned in the vicinity of the boundary 53.

FIG. 2C illustrates a process R of forming the color filter array 30. The color filter array 30 is also formed by forming a color filter film using the spin coating method and by patterning the color filter film, as the color filter array 20 is. The color filters of the color filter array 30 are formed in clearances of the clearances formed at the process G, in which the color filter array 20 is not formed at the process B. The film thickness of the color filter film formed at the process R may be larger then the film thickness of the color filter film 600 and the film thickness of the color filter film 700. The large thickness of the third-color filter film relatively reduces an influence of unevenness in the thickness of the third-color filter array due to the unevenness of the surfaces of the color filter arrays formed at the process G and the process B, if occurs, on unevenness in transmissivity. The thicknesses of the color filter film and the color filter array of the third color can be 110% or more of the thicknesses of color filter films and the color filter arrays of the first and second colors. For example, the thickness of the third-color filter may be 800 nm to 1,000 nm, in contrast to the first- and second-color filters having a thickness of 600 nm to 800 nm. In FIGS. 1A and 1B, the thickness of the color filter array 30 is larger than the thicknesses of the color filter arrays 10 and 20.

In FIG. 2C, the heights of the upper surfaces of the color filters (third-color filters) of the color filter array 30 are classified into three kinds and indicated by hatching. The height of the upper surface of a third-color filter RL of a first kind is smaller than the height of the upper surface of a third-color filter RH of a second kind. The upper surface of a third-color filter RM of a third kind has a height between the height of the upper surface of the third-color filter RL of the first kind and the height of the upper surface of the third-color filter RH of the second kind. The third-color filter RM of the third kind is positioned in the vicinity of the boundary 53.

The distance between the color filters 11 and 12 and the distance between the color filters 13 and 14, described above, differ from each other, but the distance (pitch) between the centers of the color filters 11 and 12 and the distance (pitch) between the centers of the color filters 13 and 14 may be equal to each other. Even if the pitch has an error due to a manufacturing error, the center-to-center distance of the color filters 11 and 12 may be 99% or more and 101% or less, or 99.9% or more and 100.1% or less of the center-to-center distance of the color filters 13 and 14. Likewise, the center-to-center distance (pitch) of the color filters 11 and 21 and the center-to-center distance (pitch) of the color filters 13 and 22 may be equal to each other. Even if the pitch has an error due to a manufacturing error, the center-to-center distance of the color filters 11 and 21 may be 99% or more and 101% or less, or 99.9% or more and 100.1% or less of the color filters 13 and 22. The arrangement pitch of the multicolor filters can be smaller than the arrangement pitch of the photoelectric conversion units 101.

First Embodiment

The shapes of the color filter arrays 10 and 20 according to a first embodiment of the present disclosure will be described.

In the first embodiment, as illustrated in FIG. 3A, the surface 420 in the peripheral portion 120 of the base member 400 is higher than the surface 410 in the central portion 110 (H10<H20).

The interlayer insulating layer, which is included in the interlayer insulating film 200, for insulating the wiring layers in the base member 400 is planarized by chemical mechanical polishing (CMP). The planarization using the CMP method causes a difference in polishing rate because of a difference in wiring density. Specifically, the polishing rate is high in the image capturing area where the wiring density is low, and the polishing rate is low in the peripheral circuit area where the wiring density is high. As a result, the thickness of the interlayer insulating film 200 can be larger in the peripheral portion 120 nearer to the peripheral circuit area than in the central portion 110. This can cause the surface 420 to be higher than the surface 410.

As illustrated in FIG. 3A, the multilayer wiring structure of the image capturing area has three wiring layers 210, 220, and 230, while the peripheral circuit area has four wiring layers 210, 220, 230, and 240. For that reason, the upper surfaces of the passivation film 310 and the planarizing film 320 in the peripheral circuit area are higher than the surfaces in the image capturing area by a thickness corresponding to the wiring layer 240. As a result, the upper surfaces of the passivation film 310 and the planarizing film 320 can be higher in the peripheral portion 120 nearer to the peripheral circuit area than in the central portion 110. This can cause the surface 420 to be higher than the surface 410.

The color filter film 600 formed on the base member 400, which serves as a foundation having no local unevenness, by a coating method at step Gb illustrated in FIG. 3B can have a film thickness substantially equal in the central portion 110 and in the peripheral portion 120 because of the surfaces 410 and 420 of the foundation base member 400. For that reason, the height difference of the upper surface of the color filter film 600 corresponds to the height difference HD0 of the surface of the base member 400.

In the first embodiment, the width W1 of the clearance 1 in the X-direction is larger than the width W2 of the clearance 2 in the X-direction (W1>W2). As described above, the width W1 is preferably 101% or more of the width W2 and also 110% or less, and more preferably, 105% or less. The width W3 of the clearance 3 in the Y-direction is larger than the width W4 of the clearance 4 in the Y-direction (W3>W4). The clearance GL of the first kind, represented by the clearance 1 having the width W1, is positioned in the central portion 110, and the clearance GS of the second kind, represented by the clearance 2 having the width W2, is positioned in the peripheral portion 120.

The color filters 11 and 12 on both sides of the clearance 1 are positioned in the central portion 110, and the color filters 13 and 14 on both sides of the clearance 2 are positioned in the peripheral portion 120. The line widths of the color filters 11 and 12 in the central portion 110 are smaller in the X-direction than the line widths of the color filters 13 and 14 in the peripheral portion 120.

Figure 5A:
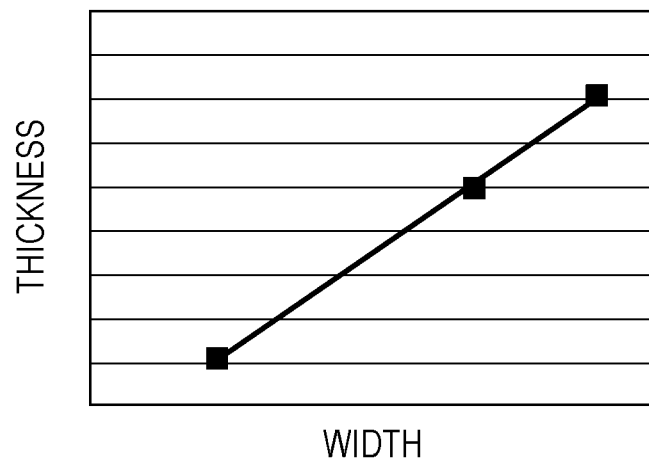
FIGS. 5A and 5B are graphs for illustrating the method for forming the MCFA according to the embodiment.

The thickness of the color filter film 700 formed using a coating method on the base member 400, which is a foundation having local unevenness due to the color filter array 10, is influenced by the shape of the color filter array 10. In other words, the upper surface of the color filter film 700 tends to be lower in height in a wide interval portion of the color filter array 10 than in a narrow interval portion of the color filter array 10. This can be thought of as follows. Assume that the volume of the material of the color filters, which is a liquid composition supplied per unit area, is constant. Each clearance of the color filter array 10 serves as a container of the color filter material. The narrow clearance of the color filter array 10 means that the bottom area of the container is small. The liquid level of a constant volume of liquid composition held in a container with a small bottom area is high. This leads to a phenomenon in which the upper surface of the color filter film 700 tends to be high in the narrow interval portions of the color filter array 10. This phenomenon can be suitably used when the viscosity of the liquid composition, which is the material of the color filter film 700 to be applied to the base member 400, is 1 mPa·S to 20 mPa·S. This phenomenon can also be suitably used when the rotational speed in the spin coating method is 300 rpm to 2,500 rpm. FIG. 5A illustrates the relationship between the line width (the horizontal axis, WIDTH) of each of color filters on both sides of one clearance and the film thickness (the vertical axis, THICKNESS) of a color filter disposed in the clearance. The width of the clearance decreases and the film thickness of the color filter formed in the clearance increases as the line width of each of the color filters on both sides increases. The inclination in FIG. 5A is, for example, 0.05 to 0.25. For example, changing the width of the clearance of the first-color filter by 100 nm allows the film thickness of the second-color filter formed in the clearance to be changed by about 5 nm to 25 nm.

The thickness of the color filter film 700 can be controlled by adjusting the width of the clearance, as described above.

For that reason, even if the line widths of color filters on both sides of the clearance of the color filter array 10 are equal, the thickness of the color filter film 700 can be controlled by changing the width of the clearance. However, the thickness of the color filter film 700 can also be controlled by adjusting the line widths of color filters on both sides of the clearance of the color filter array 10. This is because the liquid composition serving as the material of the color filter film 700 is also formed on the color filters on both sides. The larger the widths of the color filters on both sides, the more advantageous to keep the height of the upper surface of the color filter film 700 on the clearance high. Therefore, it is effective to decrease the width of the clearance and increase the line widths of color filters on both sides of the clearance in order to increase the thickness of the color filter disposed in the clearance. To decrease the thickness of the color filter, reverse this. As illustrated in FIG. 2A, constituting the plurality of color filters of the color filter array 11 so as to be partially continuous at the corners allows the clearance to be enclosed without break by the color filters of the color filter array 11. This configuration prevents the color filter material from flowing out of the clearance to another clearance, which is advantageous in controlling the thickness of the color filter film by adjusting the width of the clearance.

The height H21 of the upper surface of the color filter 21 and the height H22 of the upper surface of the color filter 22 differ from each other (H22≈H21) on the basis of the relationship illustrated in FIG. 5A. In the present embodiment, the height H22 is larger than the height H21 (H22>H21). In the present embodiment, the height L22 is larger than the height L21 (L22>L21). The height L21 approximately corresponds to the height H10, and the height L22 approximately corresponds to the height H20. The relation L22>L21 holds because H20>H10.

As illustrated in FIG. 2B, the second-color filter BL of the first kind represented by the color filter 21 having the thickness T21 is positioned in the central portion 110. The second-color filter BH of the second kind represented by the color filter 22 having the thickness T22 is positioned in the peripheral portion 120.

Let TD2 be the difference between the thickness T21 of the color filter 21 and the thickness T22 of the color filter 22 (TD2=T22−T21). The difference in thickness, TD2, is smaller than the difference (L22−L21) between the height L21 of the lower surface of the color filter 21 and the height L22 of the lower surface of the color filter 22 (TD2=T22−T21<L22−L21). The thickness T21 of the color filter 21 and the thickness T22 of the color filter 22 may be equal to each other. The thickness T21 of the color filter 21 corresponds to the distance between the upper surface and the lower surface of the color filter 21 and corresponds to the difference (T21=H21−L21) between the height H21 and the height L21. Likewise, the thickness T22 of the color filter 22 corresponds to the distance between the upper surface and the lower surface of the color filter 22 and corresponds to the difference (T22=H22−L22) between the height H22 and the height L22.

Therefore, T22−T21<L22−L21 means that the difference (TD2) between the thicknesses of the color filters 21 and 22 is smaller than the height difference (HD0) of the surface of the base member 400 which is the foundation (TD2<HD0). The difference in thickness, TD2, can be reduced to one fifth or less, or even one tenth or less of the height difference HD0. For example, when the height difference between the surfaces 410 and 420 of the base member 400 is 100 nm to 300 nm, the difference in thickness between the color filters 21 and 22 can be set to about 10 nm to 30 nm.

By decreasing the difference in thickness, TD2, between the color filters 21 and 22, the difference in transmittance between the color filters 21 and 22 can be decreased. In the image capturing device IS, the difference in sensitivity between the pixel of the color filter 21 and the pixel of the color filter 22 can be decreased. In the display device DP, the difference in luminance between the pixel of the color filter 21 and the pixels of the color filter 22 can be decreased.

Comparative Embodiment

Figure 9A:
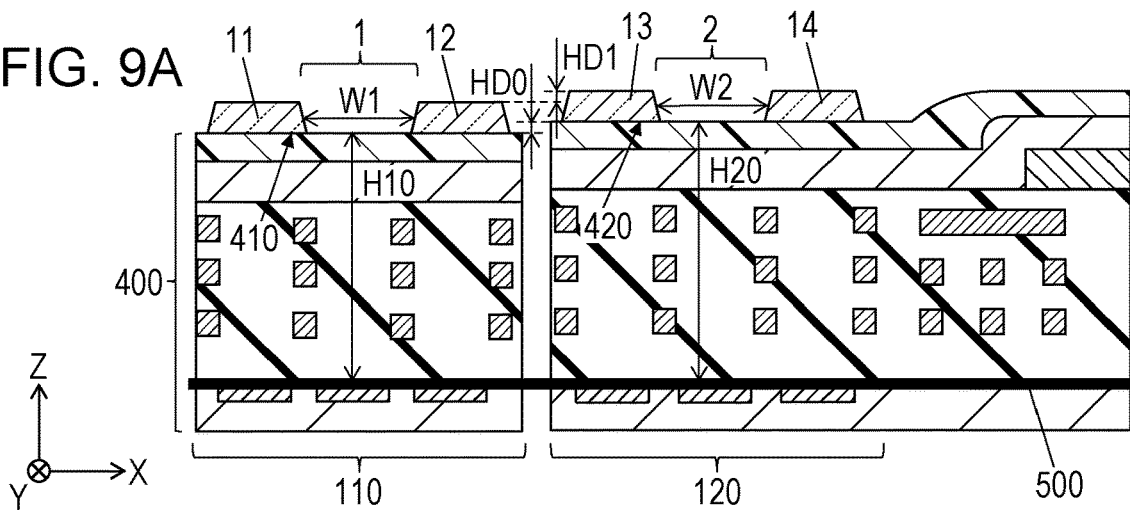
FIGS. 9A to 9C are schematic cross-sectional views of an MCFA illustrating a method for forming the MCFA according to a comparative embodiment.
Figure 9B:
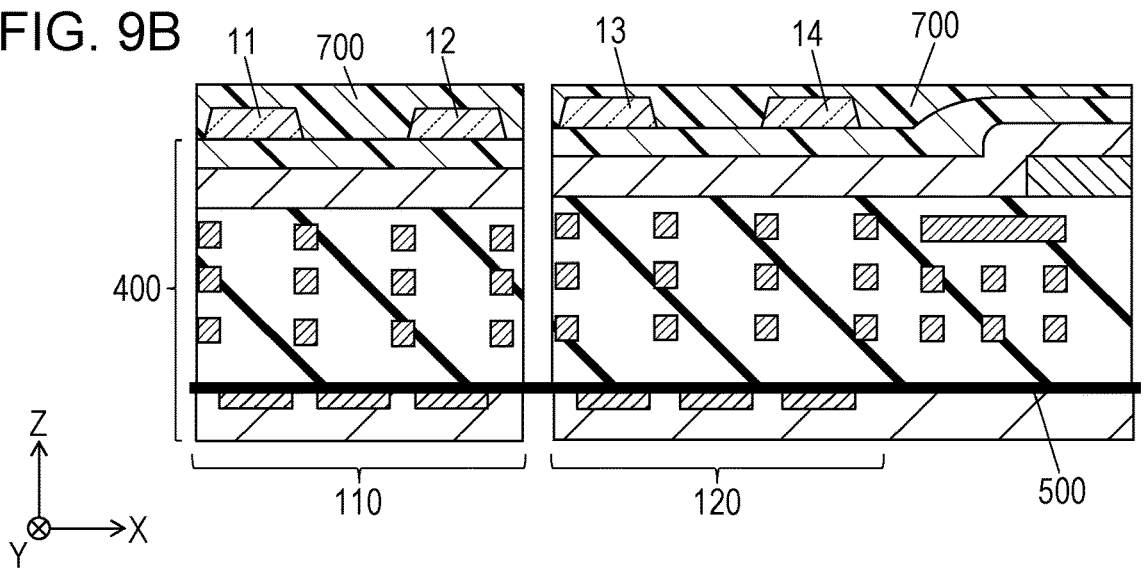
Figure 9C:
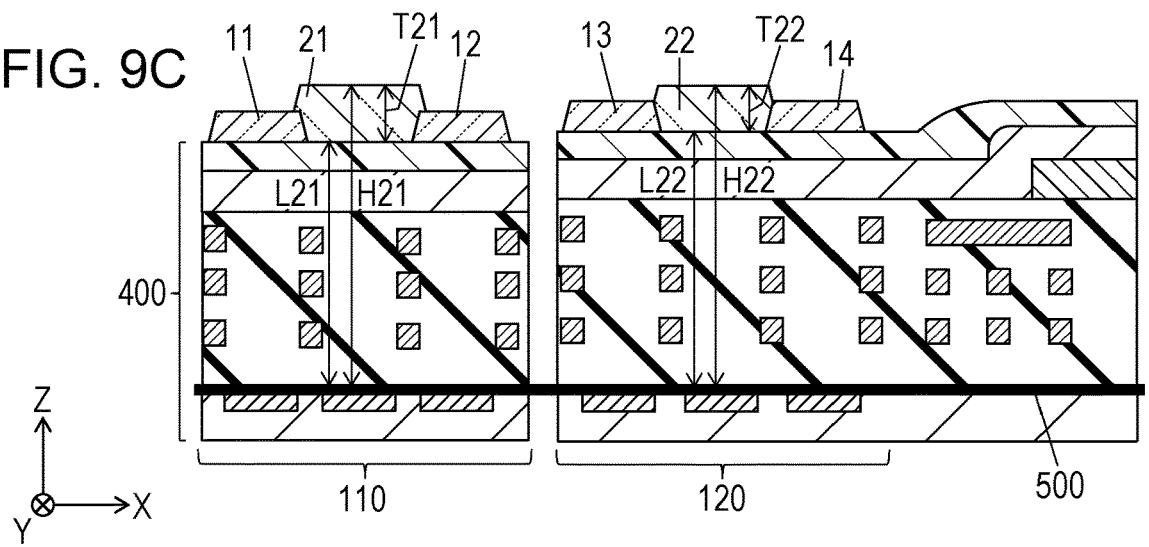

FIGS. 9A to 9C illustrate a comparative embodiment in which the base member 400 (H10<H20) of the first embodiment illustrated in FIG. 3A is subjected to a different process at steps corresponding to the steps in FIGS. 4A to 4C.

FIG. 9A illustrates a step similar to FIG. 4A, but the width W1 of the clearance 1 is equal to the width W2 of the clearance 2 (W1=W2). FIG. 9B illustrates a step similar to FIG. 4B. There is little height difference in the upper surface of the color filter film 700 between the central portion 110 and the peripheral portion 120.

FIG. 9C illustrates a step similar to FIG. 4C. When the color filter film 700 whose upper surface has little height difference is patterned, the height H21 of the upper surface of the color filter 21 and the height H22 of the upper surface of the color filter 22 become equal to each other (H21=H22). Meanwhile, the height L21 of the lower surface of the color filter 21 becomes lower than the height L22 of the lower surface of the color filter 22 (L21<L22) in correspondence with the relationship between the height H10 of the surface 410 of the base member 400 and the height H20 of the surface 420 (H10<H20). Therefore, the thickness T21 (T21=H21−L21) of the color filter 21 becomes larger than the thickness T22 (T22=H22−L22) of the color filter 22. This increases the difference in transmittance between the pixels of the color filters 21 and 22 and increases the difference in transmittance between the pixel of the color filter 21 and the pixel of the color filter 22. This difference in transmittance causes the amount of light passing through the color filters to be larger in the peripheral portion 120 than in the central portion 110, causing color shading.

In contrast, the first embodiment reduces the difference in thickness between the color filters 21 and 22 formed in the clearances 1 and 2 by making the widths of the clearance 1 and the clearance 2 different, thereby reducing the difference in transmittance between the color filters 21 and 22.

Second Embodiment

There are two major differences between the second embodiment and the first embodiment. The first difference is that the height H10 of the surface 410 in the central portion 110 is larger than the height H20 of the surface 420 in the peripheral portion 120 (H10>H20). The second difference is that the color filters 11 and 12 and the clearance 1 therebetween are positioned in the peripheral portion 120, and the color filters 13 and 14 and the clearance 2 therebetween are positioned in the central portion 110.

Figure 6A:
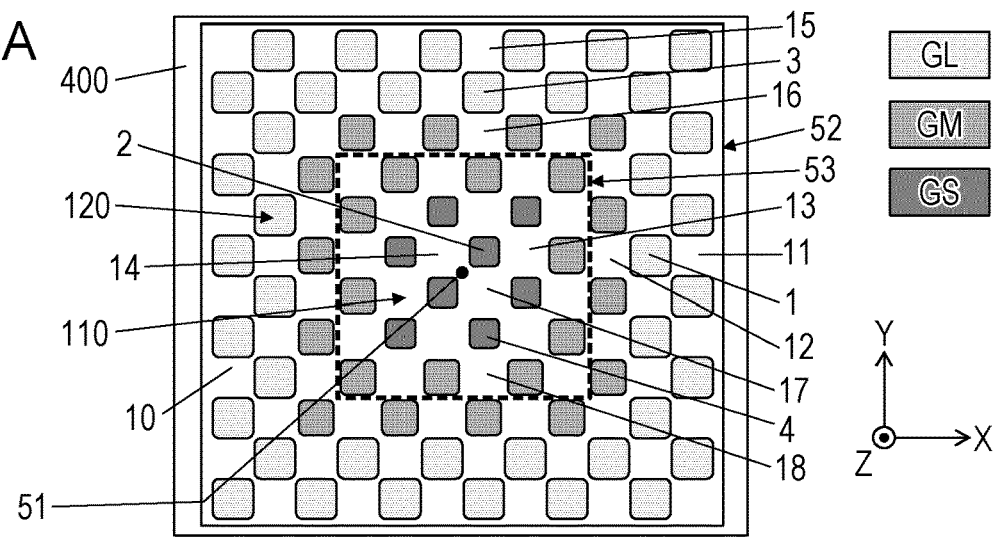
FIGS. 6A to 6C are schematic plan views of an MCFA illustrating a method for forming the MCFA according to a second embodiment of the present disclosure.
Figure 6B:
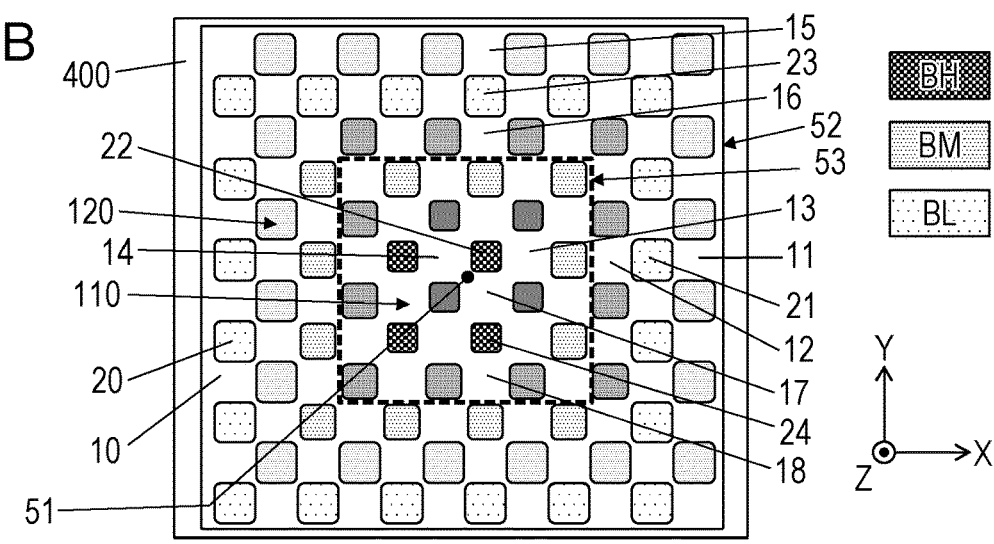
Figure 6C:
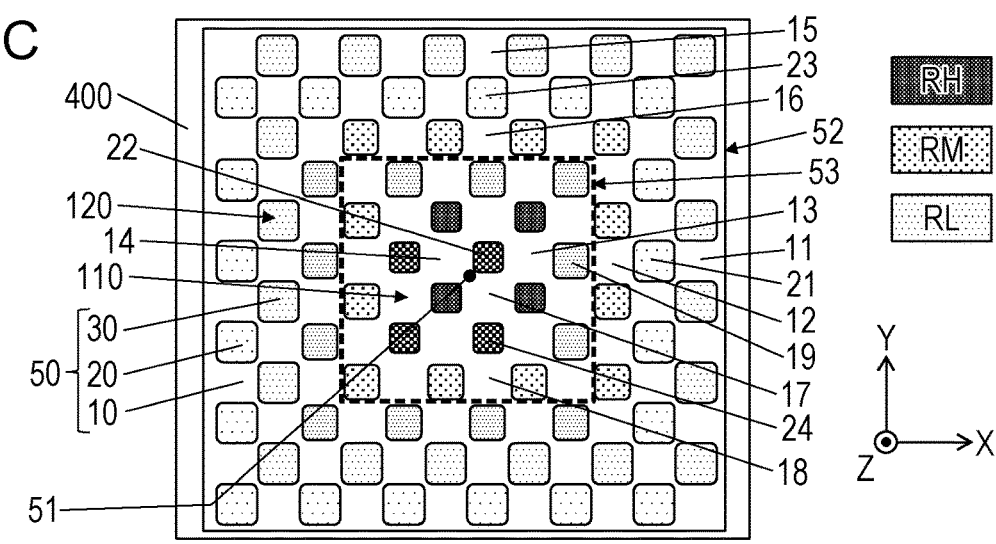

FIGS. 6A to 6C are diagrams similar to FIGS. 2A to 2C, but the clearance GL of the first kind represented by the clearance 1 having the width W1 is positioned in the peripheral portion 120, and the clearance GS of the second kind represented by the clearance 2 having the width W2 is positioned in the central portion 110. The second-color filter BL of the first kind represented by the color filter 21 having the thickness T21 is positioned in the peripheral portion 120, and the second-color filter BH of the second kind represented by the color filter 22 having the thickness T22 is positioned in the central portion 110. The third-color filter RL of the first kind is positioned in the peripheral portion 120, and the third-color filter RH of the second kind is positioned in the central portion 110.

Figure 7A:
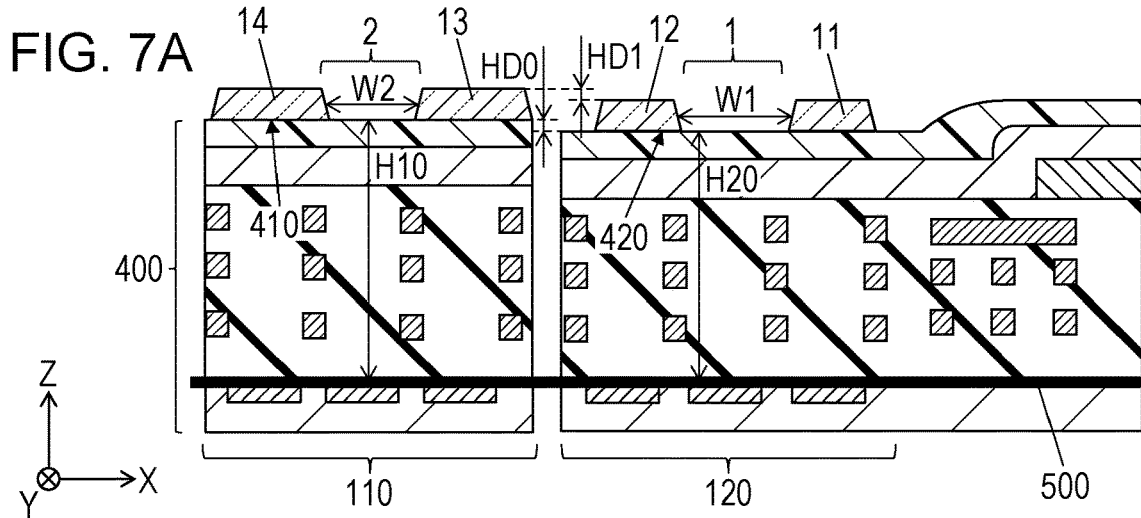
FIGS. 7A to 7C are schematic cross-sectional views of the MCFA illustrating the method for forming the MCFA according to the second embodiment.

FIG. 7A illustrates a step corresponding to FIG. 4A. The color filter array 10 includes the pair of color filters 11 and 12 disposed in the peripheral portion 120 with the clearance 1 therebetween and includes the pair of color filters 13 and 14 disposed in the central portion 110 with the clearance 2 therebetween. The width W1 of the clearance 1 in the X-direction is larger than the width W2 of the clearance 2 in the X-direction (W1>W2).

The color filter array 10 further includes the pair of color filters 15 and 16 disposed in the peripheral portion 120 with the clearance 3 therebetween, and includes the pair of color filters 17 and 18 disposed in the central portion 110 with the clearance 4 therebetween. The width W3 of the clearance 3 in the Y-direction is larger than the width W4 of the clearance 4 in the Y-direction (W3>W4).

Figure 7B:
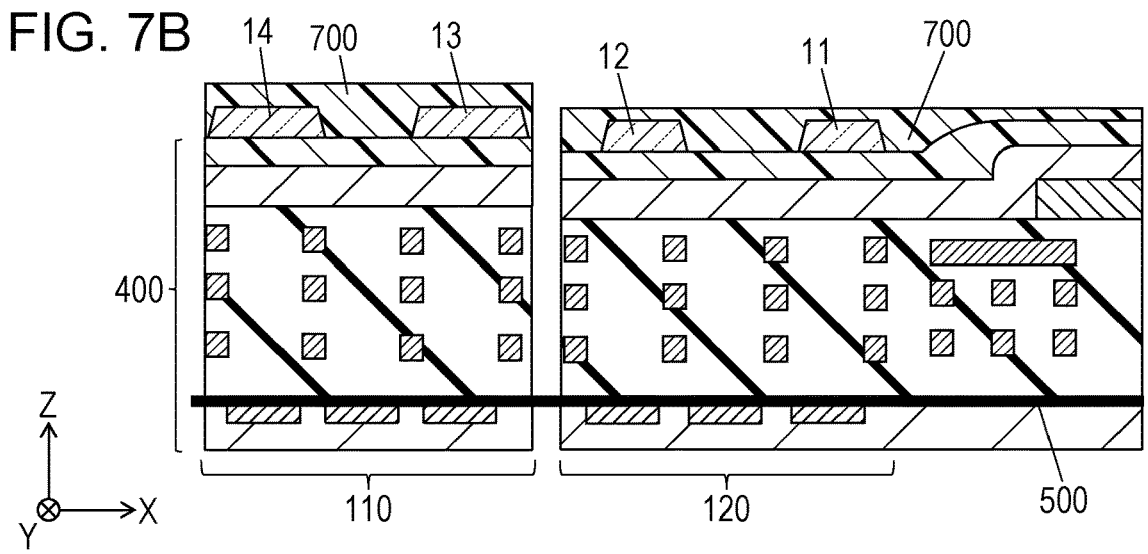

FIG. 7B illustrates a step corresponding to FIG. 4B. The thickness of the color filter film 700 formed using a coating method on the base member 400, which is a foundation having local unevenness due to the color filter array 10, is influenced by the shape of the color filter array 10. In other words, the upper surface of the color filter film 700 tends to be lower in height in a wide interval portion of the color filter array 10 than in a narrow interval portion of the color filter array 10.

Figure 7C:
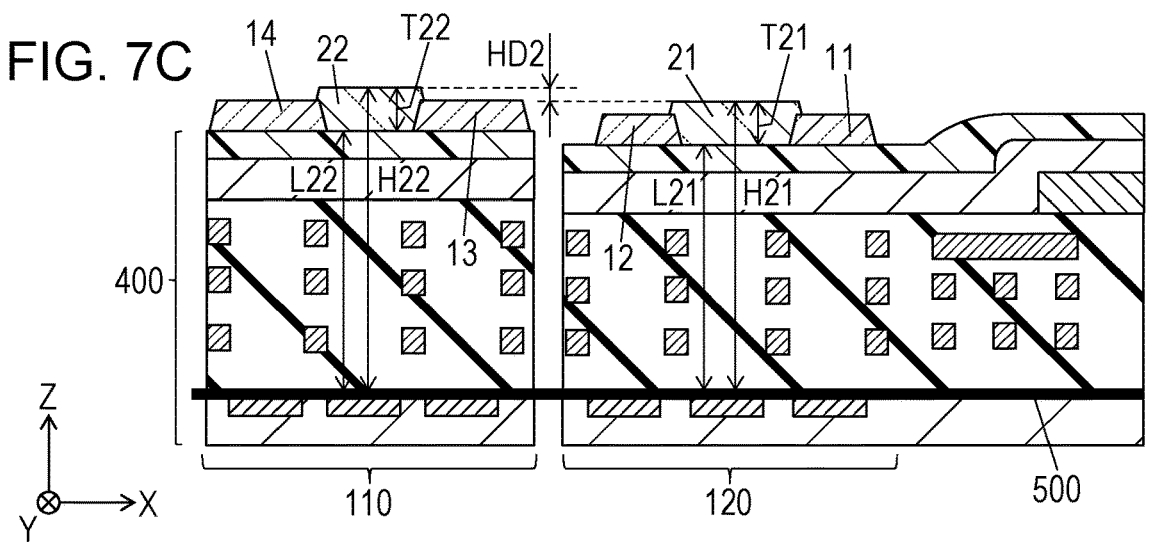

FIG. 7C illustrates a step corresponding to FIG. 4C. The upper surface of the color filter film 700 is lower in the peripheral portion 120 than in the central portion 110. Therefore, this also applies to the upper surfaces of the color filters 21 and 22 obtained by patterning the color filter film 700. In other words, the height H21 of the upper surface of the color filter 21 positioned in the peripheral portion 120 is less than the height H22 of the upper surface of the color filter 22 positioned in the central portion 110 (H22>H21). In the present embodiment, the relation L22>L21 holds because H10>H20. Let TD2 be the difference between the thickness T21 of the color filter 21 and the thickness T22 of the color filter 22 (TD2=T22−T21). The difference in thickness, TD2, is smaller than the difference (L22−L21) between the height L21 of the lower surface of the color filter 21 and the height L22 of the lower surface of the color filter 22 (TD2=T21−T22<L22−L21). The thickness T21 of the color filter 21 and the thickness T22 of the color filter 22 may be equal to each other. This also applies to the color filters 23 and 24 positioned in the clearances 3 and 4 obtained by patterning the color filter film 700.

In the second embodiment, the surface 420 of the peripheral portion 120 is lower than the surface 410 of the central portion 110. In this case, if the clearance of the color filter array 10 is formed with a uniform width, the thickness of the color filter array 20 is larger in the peripheral portion 120 than in the central portion 110. This causes a sensitivity distribution between the central portion 110 and the peripheral portion 120, increasing the color shading. For that reason, the clearance of the color filter array 10 is increased in size in the peripheral portion 120 than in the central portion 110. This allows the difference in the film thickness of the color filter film 700 between the peripheral portion 120 and the central portion 110 to be smaller than the height difference between the surface 410 and the surface 420 in forming the color filter film 700. This allows the difference TD2 between the thickness T21 of the color filter 21 and the thickness T22 of the color filter 22 to be smaller than the difference HD0 also after the color filter array 30 is formed. This reduces the transmittance distribution of the color filters, decreasing the color shading.

Third Embodiment

A major difference between the third embodiment and the second embodiment is the relationship between the height H10 of the surface 410 in the central portion 110 and the height H20 of the surface 420 in the peripheral portion 120.

Figure 8A:
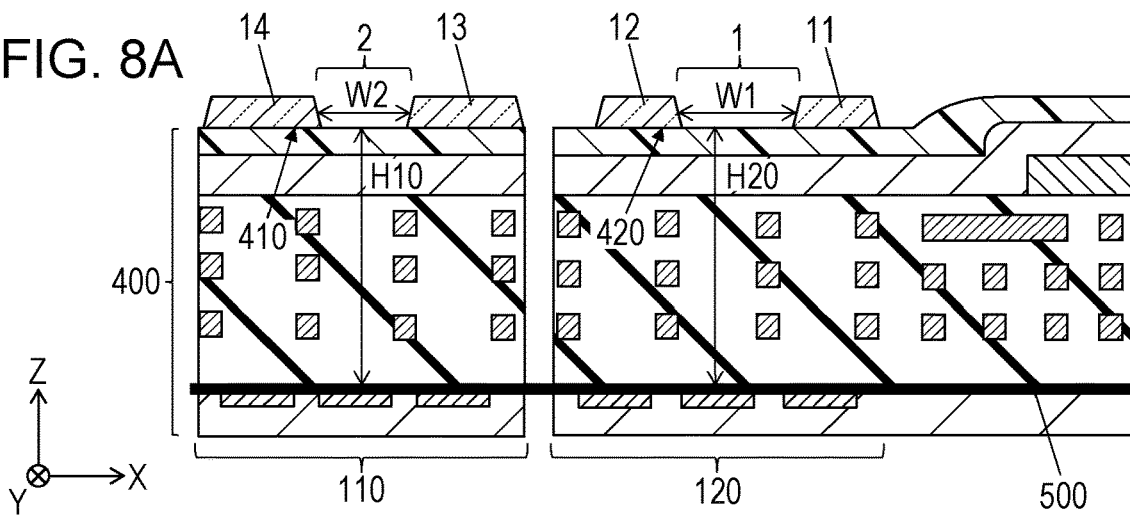
FIGS. 8A to 8C are schematic cross-sectional views of an MCFA illustrating a method for forming the MCFA according to a third embodiment of the present disclosure.

FIG. 8A illustrates a step corresponding to FIG. 7A. The difference HD0 between the height H10 of the surface 410 in the central portion 110 and the height H20 of the surface 420 in the peripheral portion 120 is small. In the present embodiment, relations H10=H20 and HD0=0 are assumed. The color filter array 10 includes a pair of color filters 11 and 12 disposed in the peripheral portion 120 with the clearance 1 therebetween and a pair of color filters 13 and 14 disposed in the central portion 110 with the clearance 2 therebetween. The width W1 of the clearance 1 in the X-direction is larger than the width W2 of the clearance 2 in the X-direction (W1>W2). The line widths of the color filters 13 and 14 in the central portion 110 are formed to be larger than the line widths of the color filters 11 and 12 in the peripheral portion 120. As a result, the clearance 1 having a large width W1 is formed in the peripheral portion 120, and the clearance 2 having a small width W2 is formed in the central portion 110.

Figure 8B:
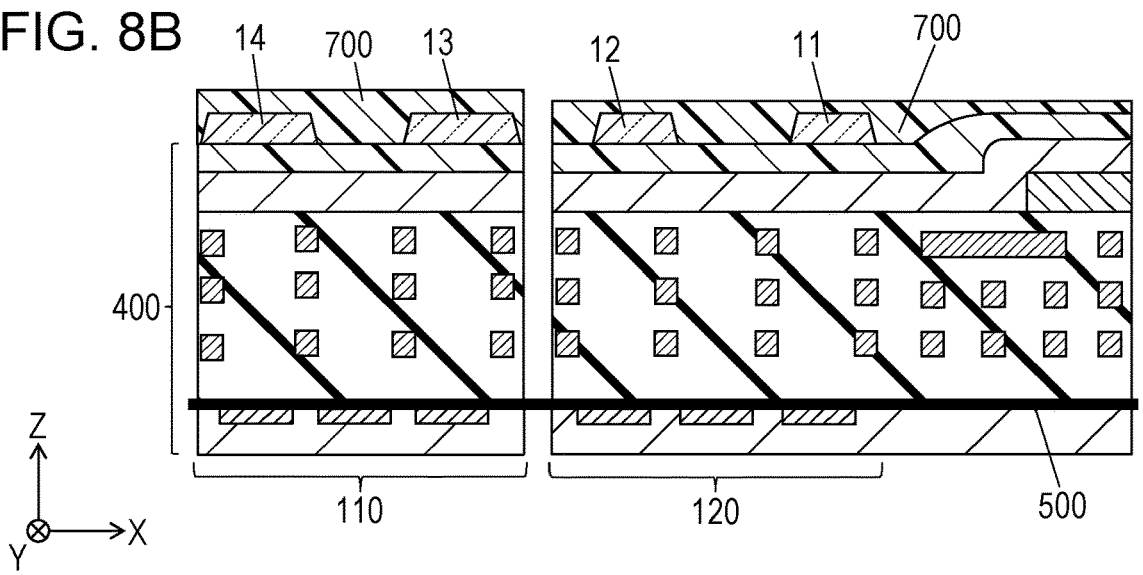

FIG. 8B illustrates a step corresponding to FIG. 4B. The thickness of the color filter film 700 formed using a coating method on the base member 400, which is a foundation having local unevenness due to the color filter array 10, is influenced by the shape of the color filter array 10. In other words, the upper surface of the color filter film 700 tends to be lower in height in a wide interval portion of the color filter array 10 than in a narrow interval portion of the color filter array 10.

Figure 8C:
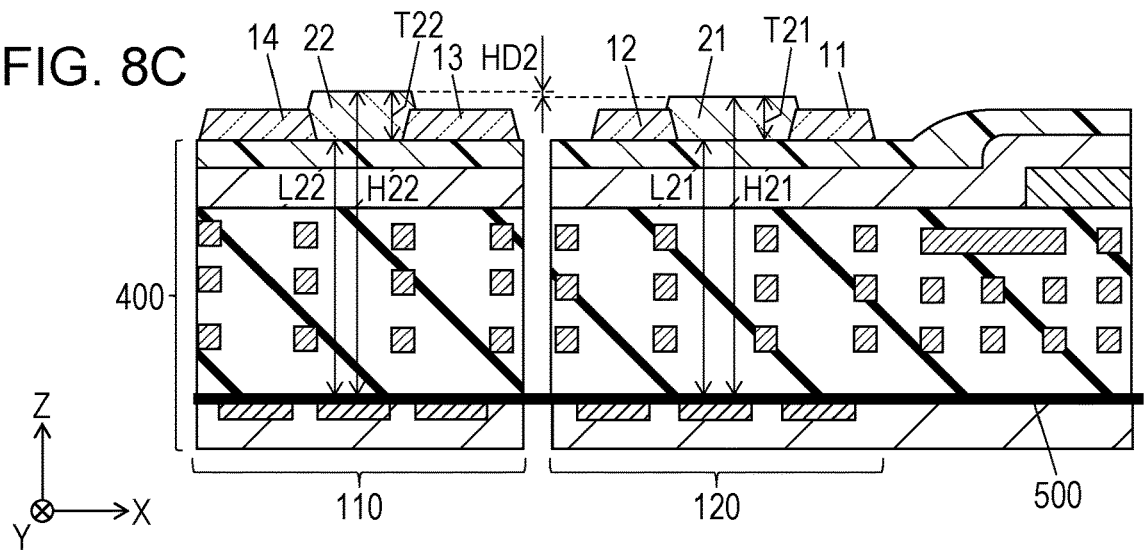

FIG. 8C illustrates a step corresponding to FIG. 4C. The upper surface of the color filter film 700 is lower in the peripheral portion 120 than in the central portion 110. Therefore, this also applies to the color filters 21 and 22 obtained by patterning the color filter film 700. In other words, the height H21 of the upper surface of the color filter 21 positioned in the peripheral portion 120 is lower than the height H22 of the upper surface of the color filter 22 positioned in the central portion 110 (H22>H21). In this embodiment, L22=L21 holds because H10=H20. For that reason, the thickness T22 of the color filter 22 is larger than the thickness T21 of the color filter 21 (T22>T21). Let TD2 be the difference between the thickness T21 of the color filter 21 and the thickness T22 of the color filter 22 (TD2=T22−T21). The difference in thickness, TD2, is larger than the difference (L22−L21) between the height L21 of the lower surface of the color filter 21 and the height L22 of the lower surface of the color filter 22 (TD2=T22−T21>L22−L21=0).

In the image capturing apparatus, light incident from an objective lens has a larger incident angle in the peripheral portion 120 than in the central portion 110 of the MCFA 50. The large incident angle causes the light incident on the pixels in the peripheral portion 120 to be eclipsed by the wiring lines, making it difficult to converge the light on the photodiodes, decreasing the sensitivity. This causes a sensitivity distribution in the image capturing area, in which the sensitivity is lower in the peripheral portion 120 than the central portion 110, producing the problem of color shading. Also in such a case, color shading can be reduced by controlling the film thickness distribution of the color filters. In other words, the transmittance of the color filters in the central portion 110 is made higher than the transmittance of the color filters in the peripheral portion 120. The transmittance of each color filter can be controlled by adjusting the thickness of the color filter, and the thickness of the color filter can be controlled by adjusting the unevenness of the foundation.

In other words, the color filter 21 in the peripheral portion 120 is formed to be thinner than the color filter 22 of the central portion 110. This compensates for the decrease in sensitivity in the peripheral portion 120 due to incident angle characteristics, thereby reducing unevenness in sensitivity distribution. This reduces color shading. Thus, color shading can be reduced when the height of the surface of the base member 400 is substantially equal in the central portion 110 and the peripheral portion 120.

Fourth Embodiment

Even if the surface 410 of the base member 400 in the central portion 110 is higher than the surface 420 in the peripheral portion 120 (H10>H20), as in the second embodiment, color shading can be reduced as in the third embodiment. In other words, in the case where a decreased in the sensitivity of the peripheral portion 120 due to incident angle characteristics is conspicuous, the thick color filter 21 is disposed in the central portion 110, and the thin color filter 22 is disposed in the peripheral portion 120. For that purpose, the color filter array 10 may be formed such that a narrow clearance 1 is disposed in the central portion 110, and a wide clearance 2 is disposed in the peripheral portion 120.

Fifth Embodiment

There is a case where it is desirable to increase the sensitivity in the central portion 110 to be higher than the sensitivity in the peripheral portion 120. In that case, the thin color filter 22 is disposed in the central portion 110, and the thick color filter 21 is disposed in the peripheral portion 120. For that purpose, the color filter array 10 is formed such that a wide clearance 2 is disposed in the central portion 110, and a narrow clearance 1 is positioned in the peripheral portion 120.

Modification

A modification of the methods for making the widths of the clearance 1 and the clearance 2 different in the above embodiments will be described.

In this modification, a condition for exposing the color filter film 600 is determined in consideration of the height difference between the surface 410 and the surface 420. A specific example of the exposure condition is the focus condition of the optical system of an exposure unit. By controlling the focus condition, the line widths of the color filters 11 and 12 and the width of the clearance 1, and the line widths of the color filters 13 and 14 and the width of the clearance 2 can be made different. As described above, the line widths of the color filters 13 and 14 can be made larger than the line widths of the color filters 11 and 12.

Figure 5B:
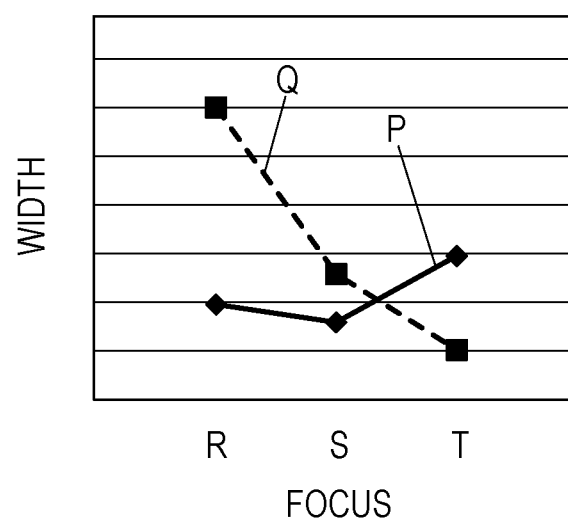

FIG. 5B is a graph illustrating the relationship between FOCUS value, which is a focus condition at the exposure of the color filter film 600 and the line width of the color filter array 10. Line P shows the relationship between the FOCUS value of a portion where the surface is low (for example, the central portion 110 in the first embodiment) and the line width of the color filter array 10. Line Q shows the relationship between the FOCUS value of a portion where the surface is high (for example, the peripheral portion 120 in the first embodiment) and the line width of the color filter array 10. The line P shows that the focus state is better (best focus value) at FOCUS value S than the focus states at FOCUS values R and T. The line Q shows that the focus state is better (best focus state) at FOCUS value T than the focus states at FOCUS values R and S.

For a negative-type color filter film, the larger deviation from the best focus value, the larger the line width of a color filter remaining in an exposed portion, and the smaller is the clearance between the color filters. For that reason, the amount of deviation from the best focus value in a portion where the wide clearance 1 is disposed is made smaller than the amount of deviation from the best focus value in a portion where the narrow clearance 2 is disposed. Thus, adopting the FOCUS value R allows the narrow clearance 2 to be disposed in a portion having a high surface, and the wide clearance 1 to be disposed in a portion having a low surface, as in the first and second embodiments.

For a positive-type color filter film, the larger the deviation from the best focus value, the larger is the clearance between color filters formed in an exposed portion. For that reason, the deviation from the best focus value in a portion where the wide clearance 1 is disposed is made larger than the deviation from the best focus value in a portion where the narrow clearance 2 is disposed. Thus, adopting the FOCUS value T shown by the line P allows the narrow clearance 2 to be disposed in a portion with a high surface, and the wide clearance 1 to be disposed in a portion with a low surface, as in the first embodiment and the second embodiment.

In this manner, using the deviation from the best focus value (defocus) allows the line width of the color filter and the width of the clearance to be changed even if the line width of the corresponding color filter and the width of the corresponding clearance in the mask pattern of the photomask are equal.

Regarding sixth to ninth embodiments of the present disclosure, common matter of the sixth to ninth embodiments will be first described.

Common Matters of Sixth to Ninth Embodiments

Figure 10A:
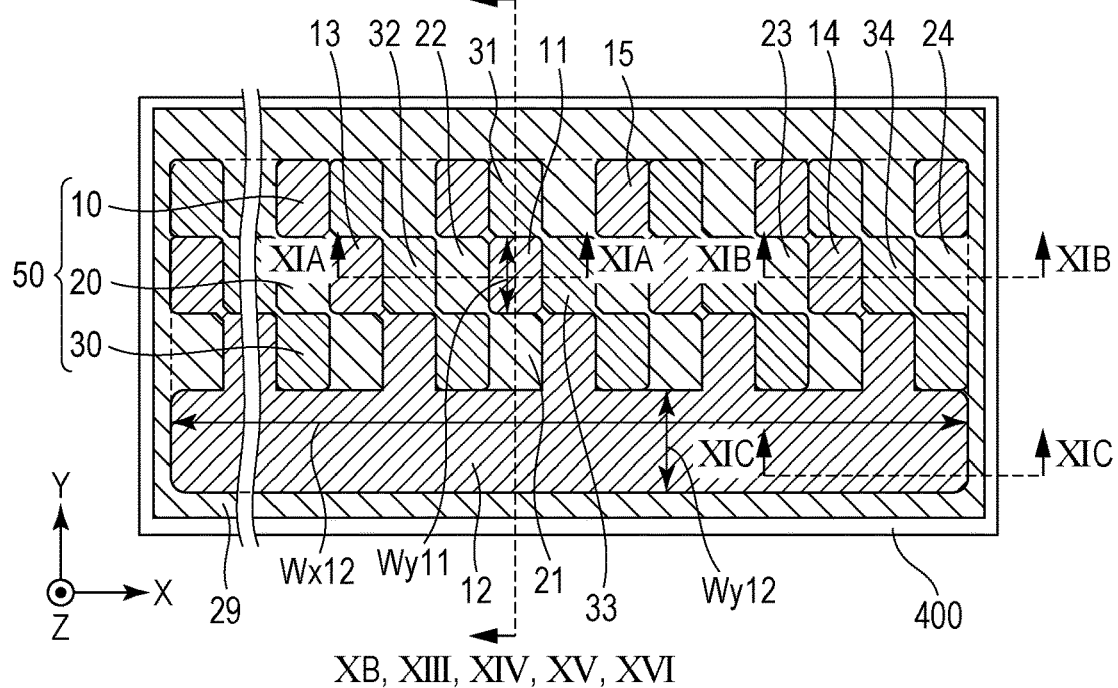
FIG. 10A is a schematic plan view of an electronic device according to an embodiment of the present disclosure.

FIG. 10A is a schematic plan view of the image capturing device IS. The image capturing device IS used as a line sensor of a scanner, in which the MCFA 50 is disposed on the base member 400. The base member 400 has a surface extending in the X-direction and in the Y-direction crossing (perpendicular to) the X-direction. The thickness and the height indicate a position in the Z-direction crossing (perpendicular to) the X-direction and the Y-direction.

The MCFA 50 is constituted by color filter arrays of multiple colors including a color filter array 10, a color filter array 20, and a color filter array 30. An area where the MCFA 50 is disposed serves as an image capturing area in an image capturing device. The color filter arrays 10, 20, and 30 of individual colors each include a plurality of color filters arranged in a one-dimensional pattern or a two-dimensional pattern in the placement area. Each of the plurality of color filters in each of the color filter arrays 10, 20, and 30 corresponds to at least one pixel. The plurality of color filters constituting the color filter arrays 10, 20, and 30 are discontinuously disposed in a certain direction. However, the plurality of color filters constituting the color filter arrays 10, 20, and 30 may be disposed partially continuously at the corners and so on. The plurality of color filters constituting the color filter arrays 10, 20, and 30 are disposed at regular intervals in a certain direction. Arrangement by color may be of a Bayer type, a honeycomb type, or a stripe type, in addition to the arrangement of the present embodiment.

The color filter arrays 10, 20, and 30 have different main wavelengths at which visible light is passed through (wavelengths at which the transmittance of visible light is maximum) for each color. For example, the color filter array 10 is formed of color filters (green filters) that mainly transmit green (G). The color filter array 20 is formed of color filters (blue filters) that mainly transmit blue (B). The color filter array 30 is formed of color filters (red filters) that mainly transmit red (R). The MCFA 50 can be formed by combining the color filter arrays 10, 20, and 30. The combination of colors is not limited to the RGB system but may be a CMY system or a combination thereof. The MCFA 50 may be configured to partially transmit white light (W). In the present embodiment, the color filter array 10 has its main wavelength in a green wavelength range, the color filter array 20 in a blue wavelength range, and the color filter array 30 in a red wavelength range.

The color filter array 10 includes color filters 11, 12, 13, 14, and 15. The color filter array 20 includes color filters 21, 22, 23, and 24. The color filter 21 is positioned between the color filter 11 and the color filter 12, and the color filter 22 is positioned between the color filter 11 and the color filter 13. The color filter array 30 includes color filters 31, 32, 33, and 34.

As will be understood from FIG. 10A, the color filters of the color filter arrays 10, 20, and 30 are arranged in the X-direction and the Y-direction. Four rows of color filters are arranged, with the color filters aligned in the X-direction as one row. R-pixels, G-pixels, and B-pixels are repeatedly arranged in the upper three rows. The color filters 11, 12, 13, and 14 are contained in the second row, and the color filter 15 is contained in the first row. 100 to 10,000 columns of color filters are arranged, with the color filters aligned in the Y-direction as one column. Each column contains a R-pixel, a G-pixel, a B-pixel contained in the upper three rows and the G-pixel contained in the lower one row. The pixels in the upper three rows allow forming a color image, and the pixels in the lower one row allow forming a monochrome image.

Figure 10B:
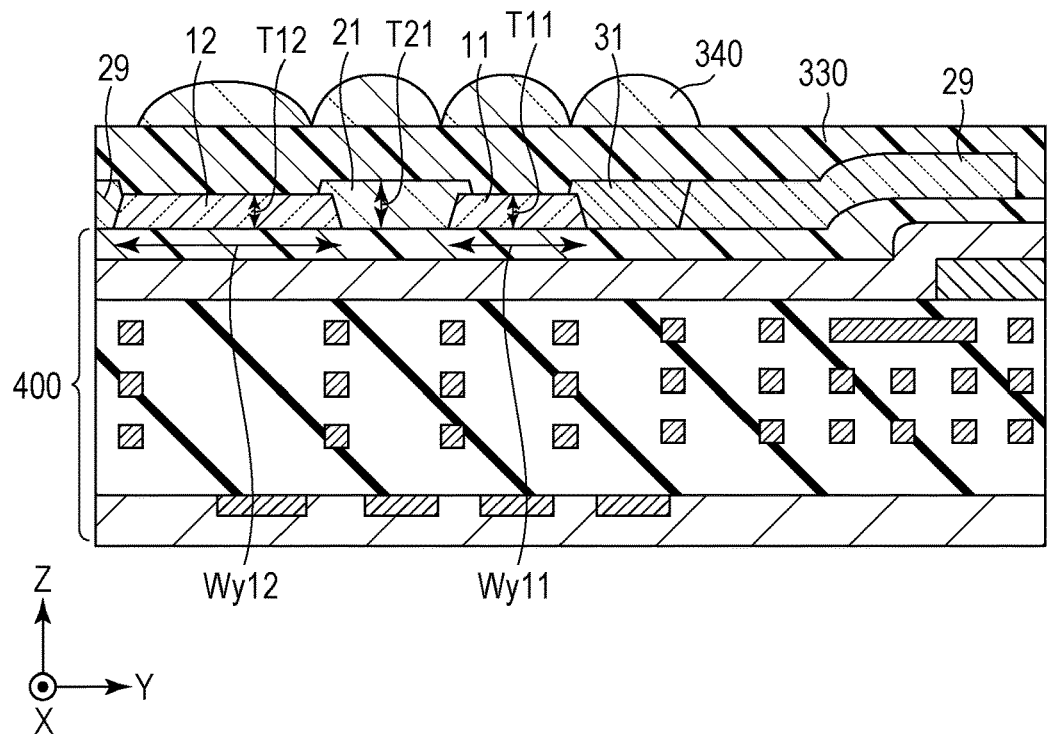
FIG. 10B is a schematic cross-sectional view of the electronic device according to the embodiment.
Figure 11A:
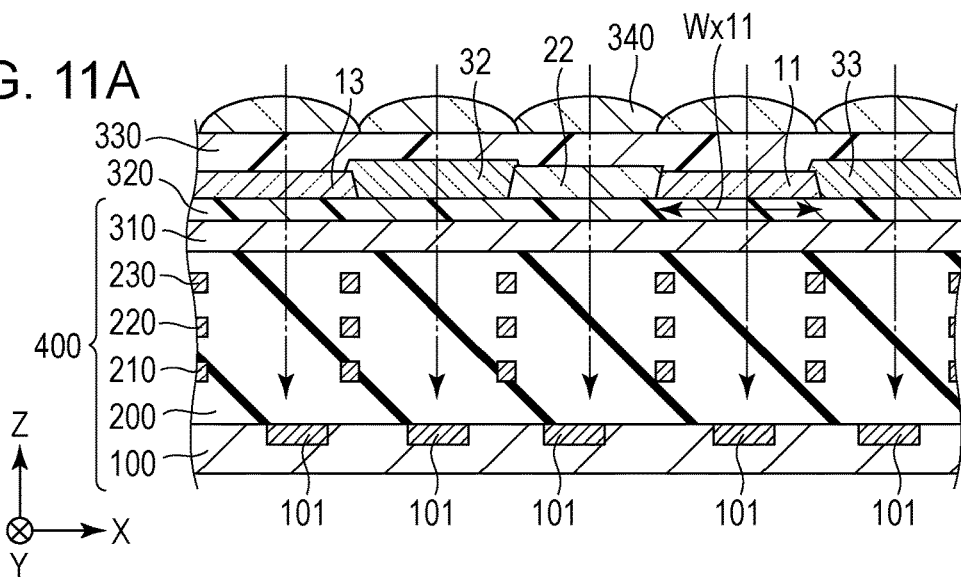
FIGS. 11A to 11C are schematic cross-sectional views of an MCFA illustrating a method for forming the MCFA according to an embodiment of the present disclosure.
Figure 11B:
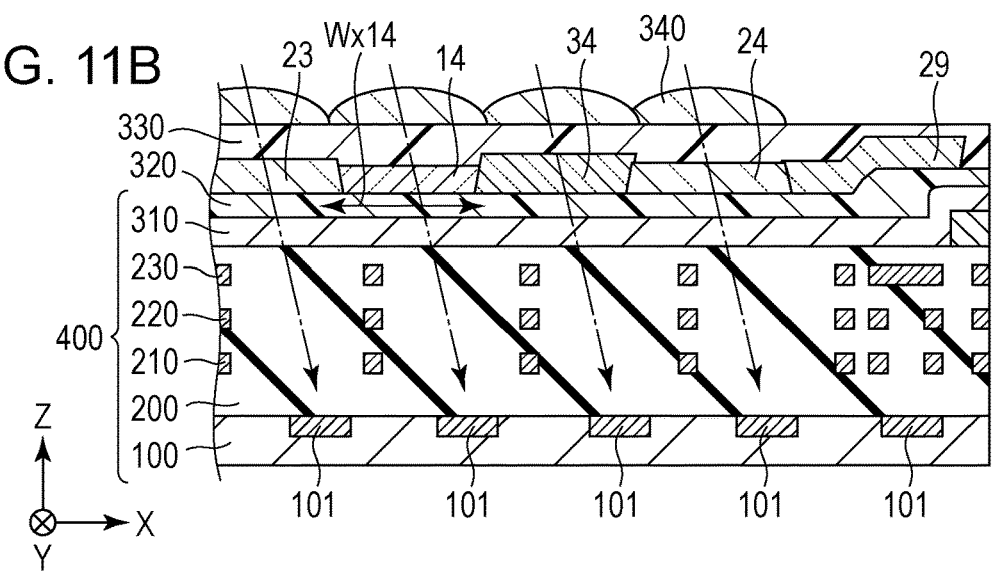
Figure 11C:
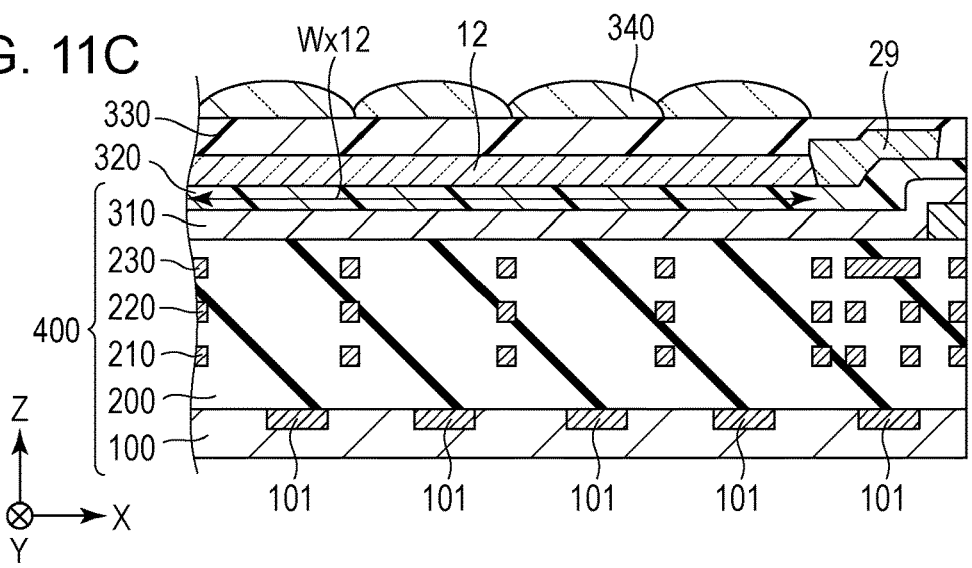

FIG. 10B illustrates how the color filters are arranged in the Y-direction, and FIGS. 11A, 11B, and 11C illustrate how the color filters are arranged in the X-direction. FIG. 10B is a cross-sectional view taken along line XB in FIG. 10A. FIG. 11A is a cross-sectional view of the central portion of the image capturing device IS taken along line XIA in FIG. 10A, and FIG. 11B is a cross-sectional view of the peripheral portion of the image capturing device IS taken along line XIB in FIG. 10A. FIG. 11C is a cross-sectional view taken along line XIC in FIG. 10A.

As illustrated in FIG. 11A, light (indicated by chain lines in FIG. 11A) enters in the central portion of the image capturing device IS at an angle substantially perpendicular to the pixels. For that reason, the center of each photoelectric conversion unit 101 and the center of each color filter substantially coincide in the X- and Y-directions. In other words, the center of each photoelectric conversion unit 101 and the center of each color filter overlap in the direction of the normal to the light receiving surface of the photoelectric conversion unit 101 (Z-direction). In contrast, as illustrated in FIG. 11B, light (indicated by chain lines in FIG. 11B) obliquely enters the pixels in the peripheral portion of the image capturing device IS. For that reason, the center of each color filter is shifted in the X-direction with respect to the center of each photoelectric conversion unit 101. In the present embodiments, pixels in the Y-direction are arranged in only four rows, so that the center of each color filter is not shifted in the Y-direction with respect to the center of each photoelectric conversion unit 101. However, in the case where 100 to 10,000 rows of pixels are provided in the Y-direction, the center of each color filter is shifted also in the Y-direction with respect to the center of each photoelectric conversion unit 101.

In order to prevent reflection of light and to shield the CMOS circuit of the peripheral circuit of the base member 400 from light, a color filter 29 is disposed in the peripheral area so as to cover the CMOS circuit. The color filter 29 is disposed so as to surround the color filter array 10. Since a photoelectric conversion unit for generating a signal charge for forming images by receiving light is not provided below the color filter 29, the color filter 29 is not a color filter constituting a pixel and is not included in the color filter array 20.

In the present embodiments, the color filter 29 is a color filter (blue filter) that mainly transmits blue (B), which is the same color as that of the color filter array 20. FIG. 10A illustrates the boundary between the color filter 29 and other color filters included in the color filter 20 using a dashed line. The color filter 29 may be a green filter or a red filter, and the color filter 12 may not be disposed.

FIGS. 10A and 10B and FIGS. 11A to 11C illustrate the widths of representative color filters. Width Wx11 is the width of the color filter 11 in the X-direction, and width Wy11 is the width of the color filter 11 in the Y-direction. Width Wx12 is the width of the color filter 12 in the X-direction, and width Wy12 is the width of the color filter 12 in the Y-direction. Width Wx14 is the width of the color filter 14 in the X-direction.

The width of the color filter 11 and the width of the color filter 12 differ from each other in at least one of the Y-direction in which the color filter 11 and the color filter 12 are arranged and the X-direction perpendicular to the Y-direction. In other words, the width Wy12 of the color filter 12 is larger than the width Wy11 of the color filter 11 in the Y-direction (Wy11<Wy12). The width Wx12 of the color filter 12 is larger than the width Wx11 of the color filter 11 in the X-direction (Wx11<Wx12). The width Wx12 of the color filter 12 in the X-direction is larger than the width Wy12 of the color filter 12 in the Y-direction (Wx12>Wy12). In the X-direction, the width Wx12 of the color filter 12 is four times or more the width Wx11 of the color filter 11 (4×Wx11≤W×12). Color filters 22 and 32 are positioned between the color filter 11 and the color filter 13 aligned in the X-direction. The width Wx12 of the color filter 12 in the X-direction is larger than the distance between the color filter 11 and the color filter 13. The width Wx12 of the color filter 12 in the X-direction is larger than the sum of the width Wx11 of the color filter 11 in the X-direction and the width Wx22 of the color filter 22 in the X-direction (Wx12>Wx11+Wx22).

Let Wdxg (Wdxg=Wx12−Wx11) be a width distribution, or the difference between the maximum width (Wx12) and the minimum width (Wx11) of the widths of all color filters of the color filter array 10 in the X-direction. Let Wdxb be a width distribution, or the difference between the maximum width and the minimum width of the widths of all color filters in the color filter array 20 in the X-direction. Let Wdxr be a width distribution, or the difference between the maximum width and the minimum width of the widths of all color filters in the color filter array 30 in the X-direction. The width distribution Wdxb and the width distribution Wdxr are smaller than the width distribution Wdxg (Wdxb<Wdxg, Wdxr<Wdxg).

Let Wdyg (Wdyg=Wy12−Wy11) be a width distribution, or the difference between the maximum width (Wy12) and the minimum width (Wy11) of the widths of all color filters of the color filter array 10 in the Y-direction. Let Wdyb be a width distribution, or the difference between the maximum width and the minimum width of the widths of all color filters in the color filter array 20 in the Y-direction. Let Wdyr be a width distribution, or the difference between the maximum width and the minimum width of the widths of all color filters in the color filter array 30 in the Y-direction. The width distribution Wdyb and the width distribution Wdyr are smaller than the width distribution Wdyg (Wdyb<Wdyg, Wdyr<Wdyg).

Thus, variation in the width in the X-direction and/or Y-direction of the color filters included in the color filter array 20 is smaller than variation in the width of the color filters included in the color filter array 10. Variation in the width in the X-direction and/or Y-direction of the color filters included in the color filter array 30 is smaller than variation in the width of the color filters included in the color filter array 10.

Of all color filters included in the color filter array 10 and excluding the color filter 12, a color filter positioned at one end in the X-direction (on the left end) is referred to as a left-end color filter. Of all color filters included in the color filter array 10 and excluding the color filter 12, a color filter positioned at the other end in the X-direction (on the right end) is referred to as a right-end color filters.

Between the left-end color filter and the color filter 12 and between the right-end color filter and the color filter 12, color filters included in the color filter array 20 and/or color filters included in the color filter array 30 are positioned. In other words, color filters of different colors from the color of the color filter 12 are disposed at the left end and right end in the third column adjacent to the color filter 12 of the fourth-column. This allows the shape of the color filter array 10 to be well controlled.

FIG. 10B and FIGS. 11A to 11C illustrate the thicknesses of representative color filters. The difference between the thickness T11 of the color filter 11 and the thickness T12 of the color filter 12 may be small, or there may be no difference between the thickness T11 and the thickness T12 (T11=T12). The thickness T11 is preferably about 92% to 108% of the thickness T12. The difference in film thickness between color filters of the same color may be smaller than the difference in film thickness between color filters of different colors. The difference (T12−T11) between the thickness T11 and the thickness T12 is preferably smaller than the difference (T21−T11) between the thickness T11 and the thickness T21 (T12−T11<T21−T11).

The difference between the thickness T11 of the color filter 11 and the thickness T15 (not shown) of the color filter 15 may be small, or there may be no difference between the thickness T11 and the thickness T15 (T11=T15). The thickness T11 is preferably about 92% to 108% of the thickness T15. The difference (T15−T11) between the thickness T11 and the thickness T15 is preferably smaller than the difference (T21−T11) between the thickness T11 and the thickness T21 (T15−T11<T21−T11).

Decreasing the difference in thickness between color filter of the same color reduces variations in the sensitivity of pixels having color filters of the same color. This reduces color unevenness of photographed images. In particular, in capturing a color image using the outputs of upper three-rows of pixels, unevenness in the sensitivity of pixels of the same color from column to column causes color shading in the image. For that reason, the difference between the thickness T11 of the color filter T11 and the thickness T15 of the color filter 15 is reduced as much as possible. In particular, the difference (T15−T11) between the thickness T11 and the thickness T15 is made smaller than the difference (T12−T11) between the thickness T11 and the thickness T12 (T15−T11<T12−T11).

Sixth Embodiment

Figure 12A:
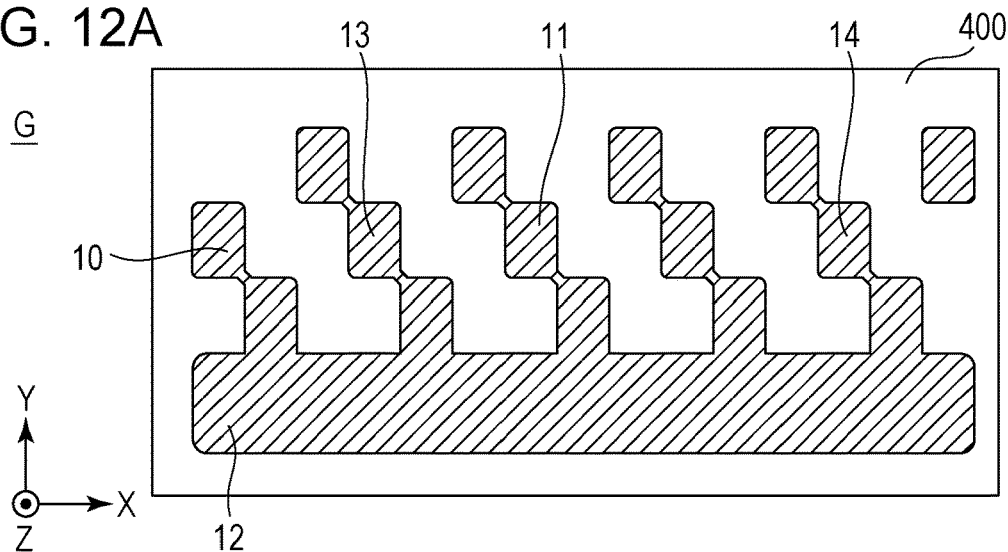
FIGS. 12A to 12C are schematic plan views of an MCFA illustrating a method for forming the MCFA according to a sixth embodiment of the present disclosure.
Figure 12B:
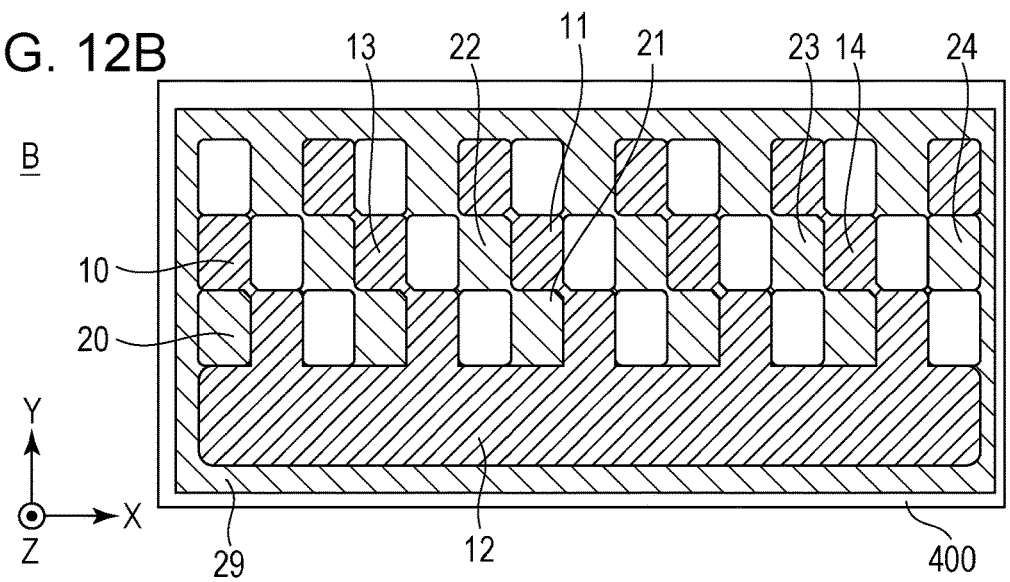
Figure 12C:
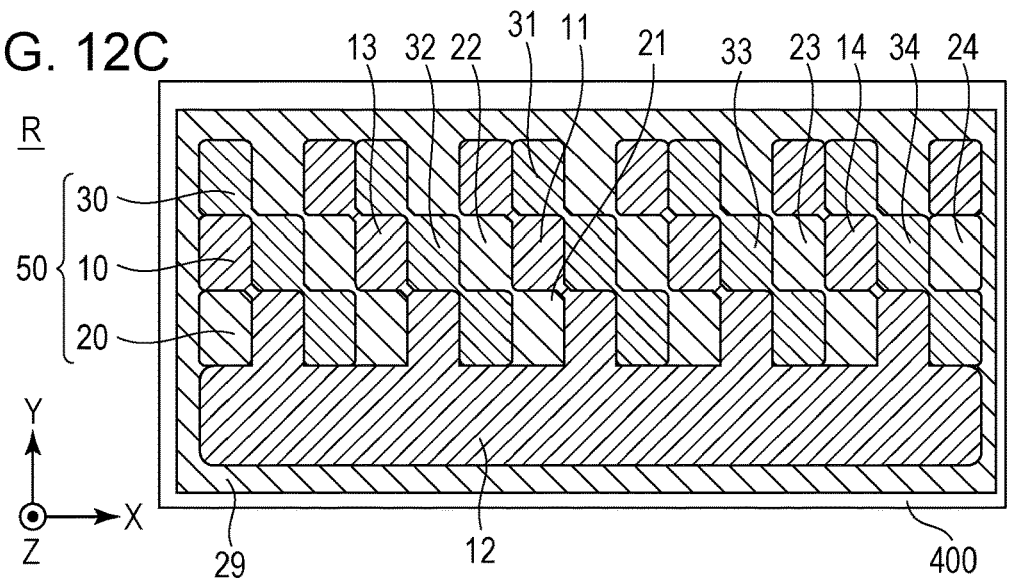

Referring to FIGS. 12A to 12C, FIG. 13A to 13C, and FIGS. 14A to 14C, the configuration of the MCFA 50 and a method for forming the MCFA 50 will be described. FIGS. 12A to 12C are plan views of the MCFA 50, of which FIGS. 12A and 12B illustrate the states in the middle of reaching the state of FIG. 12C in the process of forming the MCFA 50. First, at process G in FIG. 12A, the color filter array 10 is formed. Next, at process B in FIG. 12B, the color filter array 20 is formed. Then, at process R in FIG. 12C, the color filter array 30 is formed. Thus, the color filter array 10 including color filters having different widths is formed prior to the other color filter arrays 20 and 30. This reduces the difference in the thickness among the color filters 11 to 15 of the same color in the color filter array 10 including the color filter 11 to 15 with different widths.

FIGS. 13A to 13C and FIGS. 14A to 14C are respective cross-sectional views of the states of individual steps of the method for manufacturing an electronic device including formation of the MCFA 50, taken along lines XIII and XIV IN FIG. 10A.

Figure 13A:
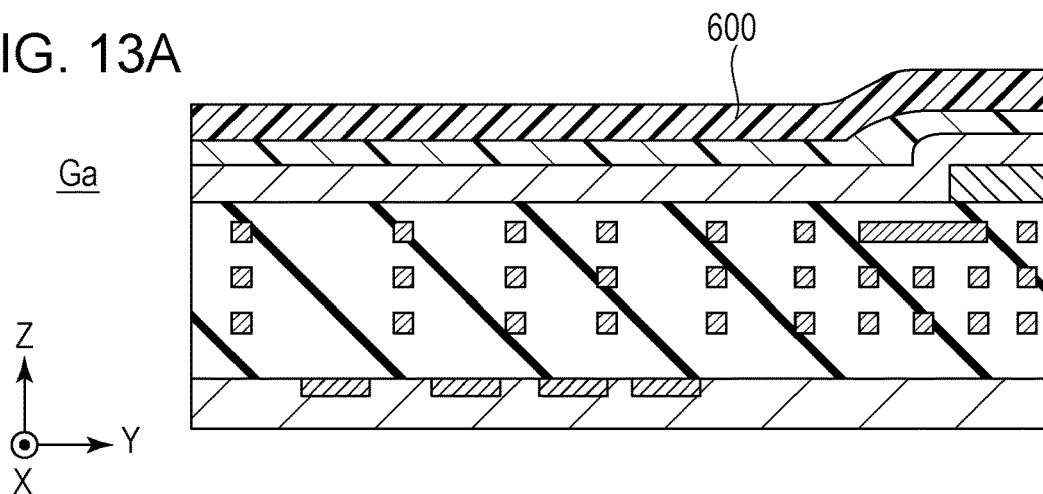
FIGS. 13A to 13C are schematic cross-sectional views of the MCFA illustrating the method for forming the MCFA according to the sixth embodiment.
Figure 13B:
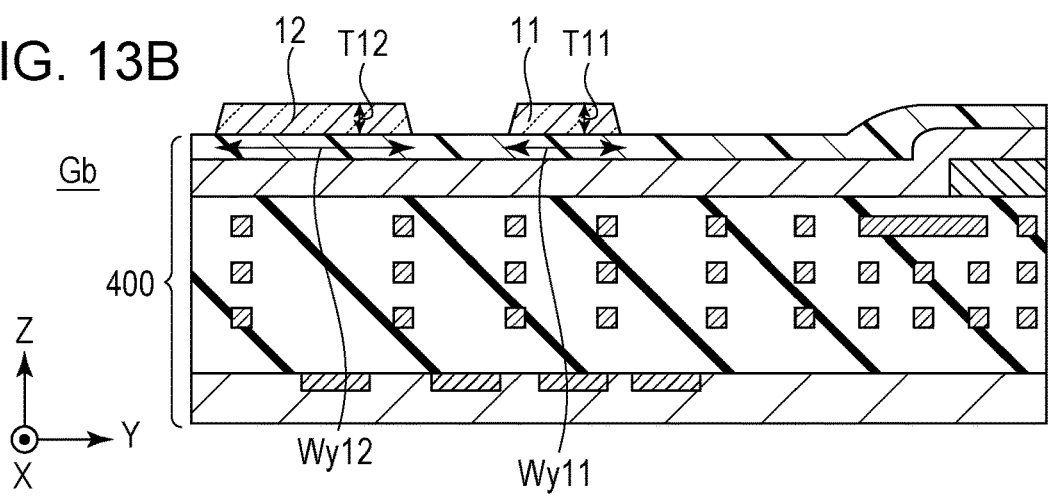

FIG. 12A illustrates the process G of forming the color filter array 10. FIGS. 13A and 13B illustrate cross-sections of individual steps included in the process G.

At step Ga illustrated in FIG. 13A, the base member 400 formed using a semiconductor process or the like is prepared, and a color filter film 600 is formed on the base member 400 using a coating method. The film thickness of the color filter film 600 is preferably from 800 nm to 1,200 nm. A typical example of the coating method is a spin coating method. Alternatively, a dipping method or a spray method may be used.

At step Gb illustrated in FIG. 13B, the color filter film 600 is patterned by photolithography (exposure and development). The color filter film 600 is exposed to light using an appropriate photomask. Although the color filter film 600 of the present embodiment is a negative-type photosensitive resin, the color filter film 600 may be a positive-type photosensitive resin. The exposed color filter film 600 is developed. The exposed part of the color filter film 600, which is a negative-type photosensitive resin, remains after the development. The part of the color filter film 600 remaining after the patterning forms the color filter array 10. In this case, the color filter 11 has a width Wy11 (and a width Wx11), and the color filter 12 has a width Wy12 (and a width Wx12). The width Wy11 is smaller than the width Wy12, and the width Wx11 is smaller than the width Wx12. However, since the color filter film 600 is uniformly formed on the surface of the base member 400 with little unevenness, the difference between the thickness T11 of the color filter 11 and the thickness T12 of the color filter 12 can be reduced.

Figure 13C:
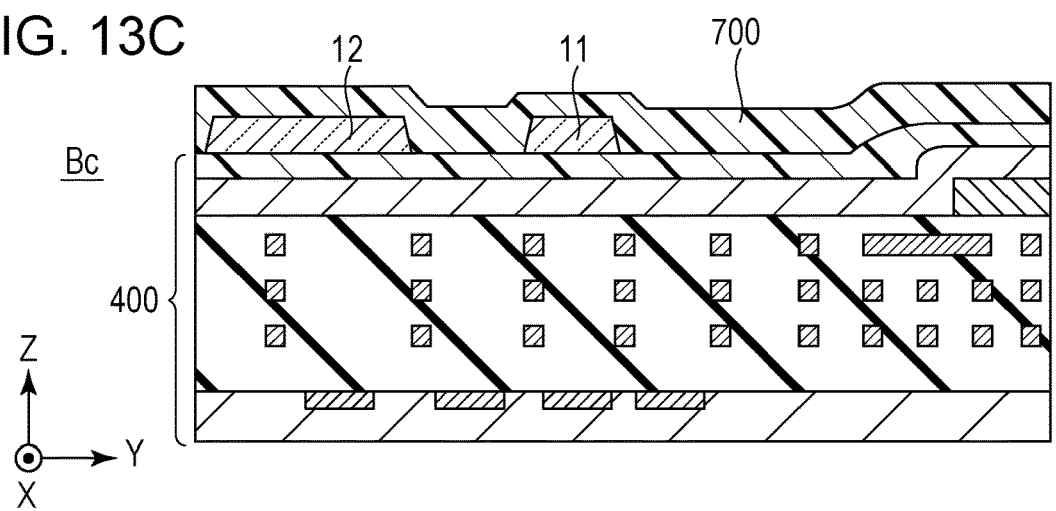
Figure 14A:
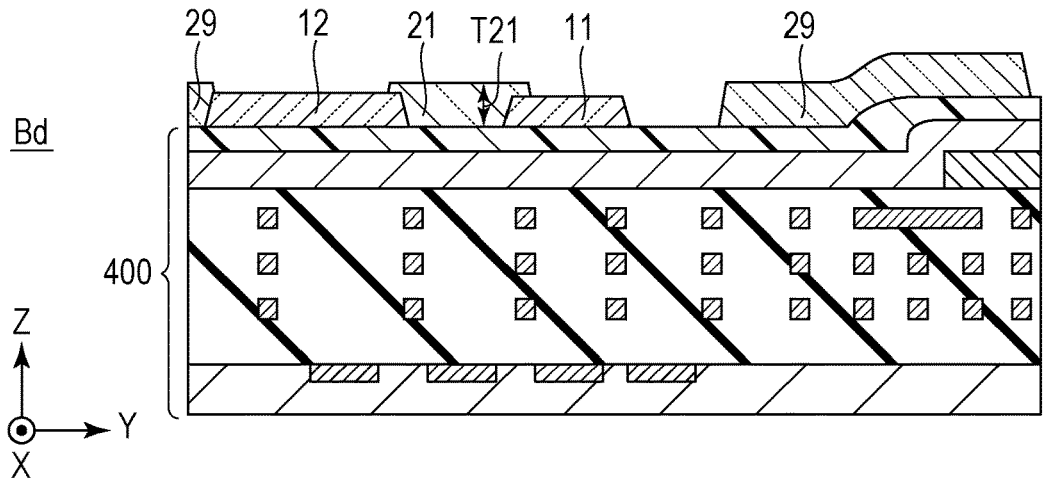
FIGS. 14A to 14C are schematic cross-sectional views of the MCFA illustrating the method for forming the MCFA according to the sixth embodiment.

FIG. 12B illustrates the process B of forming the color filter array 20. FIG. 13C and FIG. 14A illustrate the states of cross sections of individual steps included in the process B.

At step Bc illustrated in FIG. 13C, a color filter film 700 is formed on the base member 400 so as to cover the color filter array 10 using a coating method. The thickness of the color filter film 600 is preferably about 800 nm to 1,200 nm.

A typical example of the coating method is a spin coating method. Alternatively, a dipping method or a spray method may be used.

At step Bd illustrated in FIG. 14A, the color filter film 700 is patterned by photolithography (exposure and development). The color filter film 700 is exposed to light using an appropriate photomask. Although the color filter film 700 is a negative-type photosensitive resin, the color filter film 700 may be a positive-type photosensitive resin. The exposed color filter film 700 is developed. The exposed part of the color filter film 700, which is a negative-type photosensitive resin, remains after the development. The part of the color filter film 700 remaining after the patterning forms the color filter array 20.

Figure 14B:
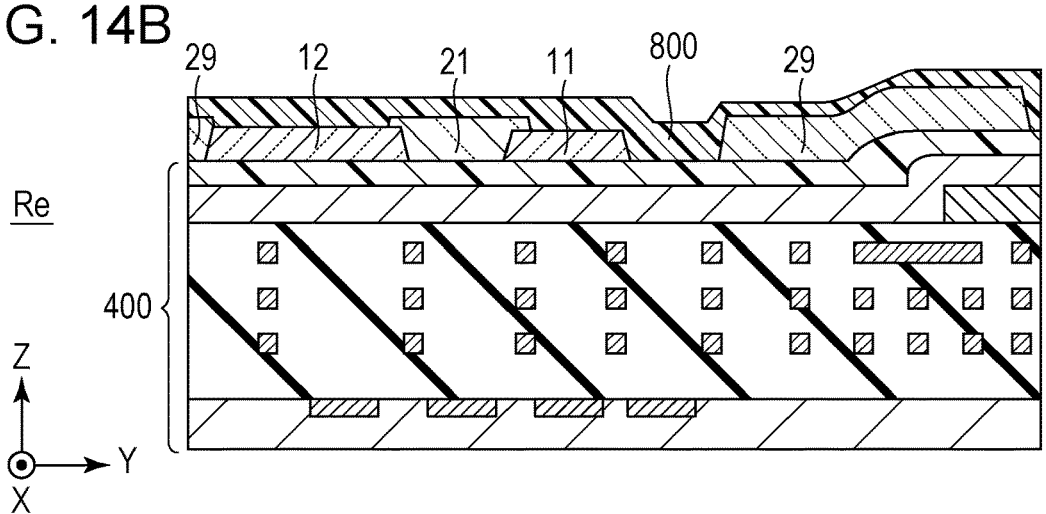
Figure 14C:
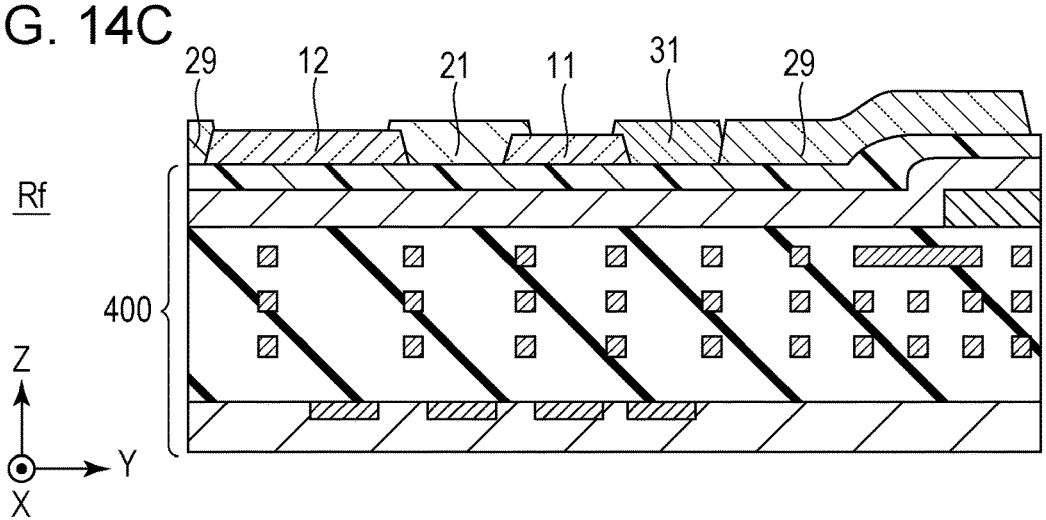

FIG. 12C illustrates the process R of forming the color filter array 30. FIGS. 14B and 14C illustrate the states of cross sections of individual steps included in the process R.

At step Re illustrated in FIG. 14B, a color filter film 800 is formed on the base member 400 so as to cover the color filter arrays 10 and 20 using a coating method. The thickness of the color filter film 800 is preferably about 800 nm to 1,200 nm. A typical example of the coating method is a spin coating method. Alternatively, a dipping method or a spray method may be used.

At step Rf illustrated in FIG. 14C, the color filter film 800 is patterned by photolithography (exposure and development). The color filter film 800 is exposed to light using an appropriate photomask. Although the color filter film 800 of the present embodiment is a negative-type photosensitive resin, the color filter film 800 may be a positive-type photosensitive resin. The exposed color filter film 800 is developed. The exposed part of the color filter film 800, which is a negative-type photosensitive resin, remains after the development. The part of the color filter film 800 remaining after the patterning forms the color filter array 30.

Comparative Embodiment

In a comparative embodiment, the process R of forming the color filter array 30 illustrated in FIG. 12C is first performed. Next, the process B of forming the color filter array 20 illustrated in FIG. 12B is performed, and then the process G of forming the color filter array 10 illustrated in FIG. 12A is performed. In the comparative embodiment, the color filter array 10 including color filters with different widths is formed after the other color filter arrays 20 and 30 are formed. This makes the difference in thickness among the color filters 11 to 15 of the same color of the color filter array 10 including the color filters 11 to 15 with different widths large.

FIGS. 15A to 15C and FIGS. 16A to 16C are respective cross-sectional views taken along lines XV and XVI illustrating the states of individual steps of the method of manufacturing the electronic device including formation of the MCFA 50.

Figure 15A:
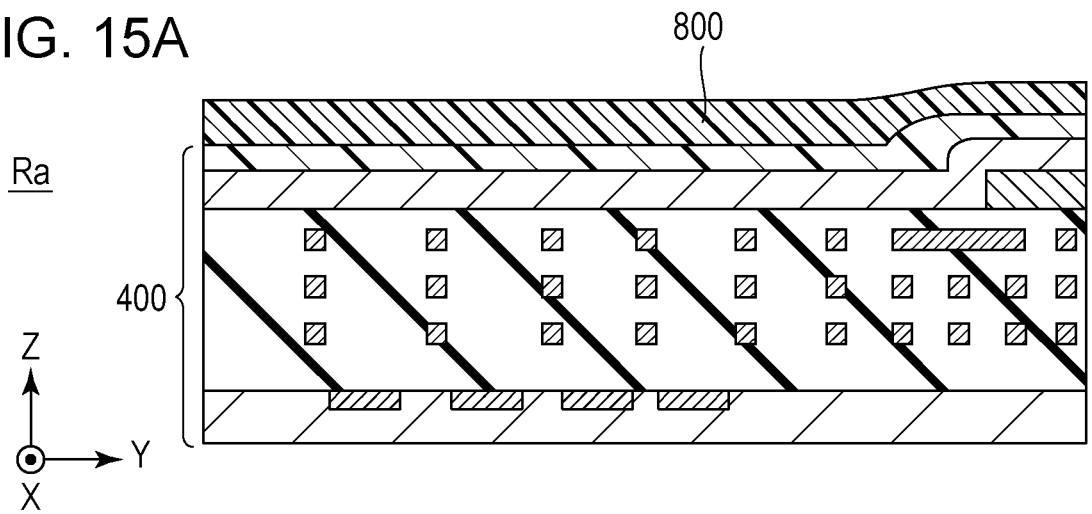
FIGS. 15A to 15C are schematic cross-sectional views of an MCFA illustrating a method for forming the MCFA according to a comparative embodiment.
Figure 15B:
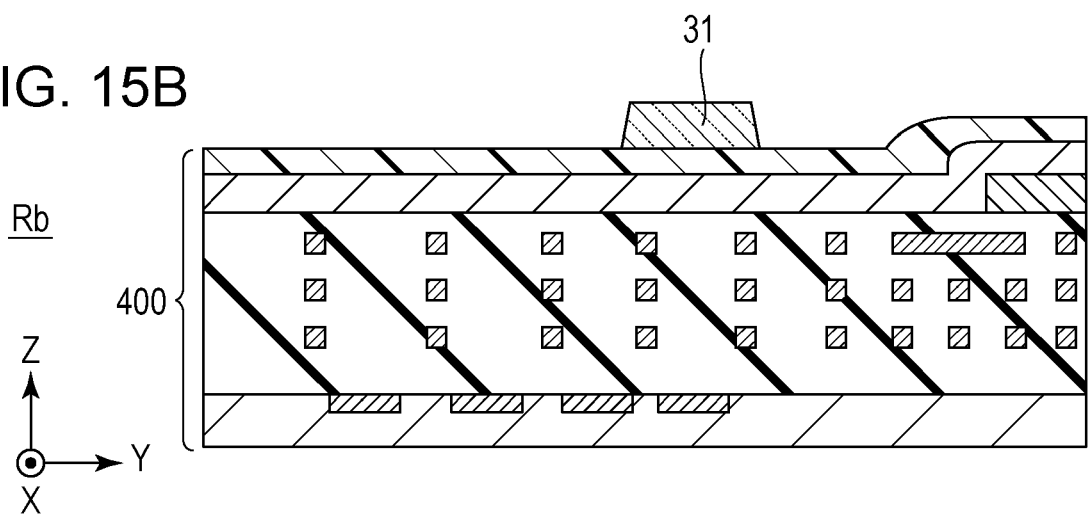

FIGS. 15A and 15B illustrate the states of individual steps included in the process R of forming the color filter array 30.

At step Ra illustrated in FIG. 15A, the base member 400 formed using a semiconductor process or the like is prepared, and a color filter film 800 is formed on the base member 400 using a coating method.

At step Rb illustrated in FIG. 15B, the color filter film 800 is patterned by photolithography (exposure and development). The color filter film 800 is exposed to light using an appropriate photomask. The exposed color filter film 800 is developed. The exposed part of the color filter film 800, which is a negative-type photosensitive resin, remains after the development. The part of the color filter film 800 remaining after the patterning forms the color filter array 30.

Figure 15C:
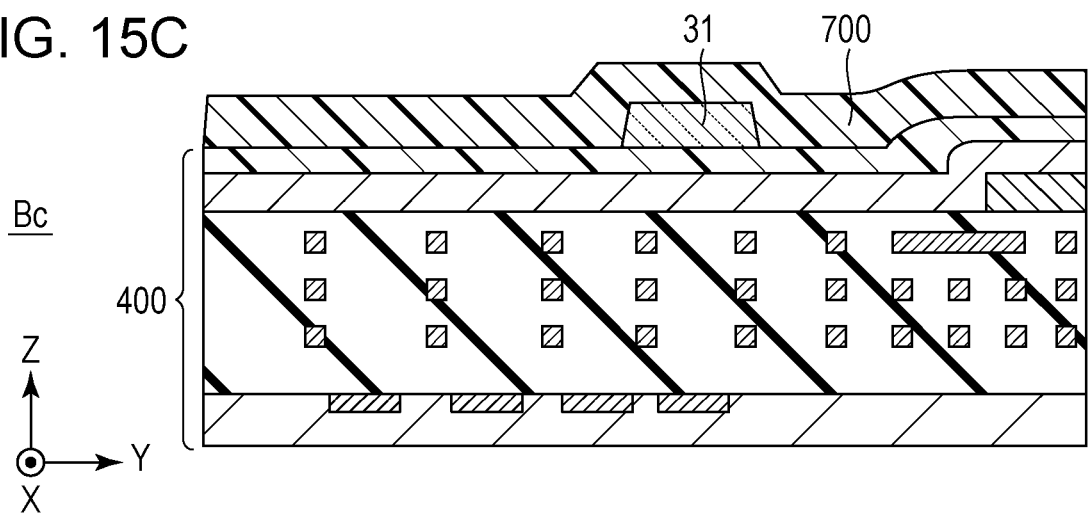
Figure 16A:
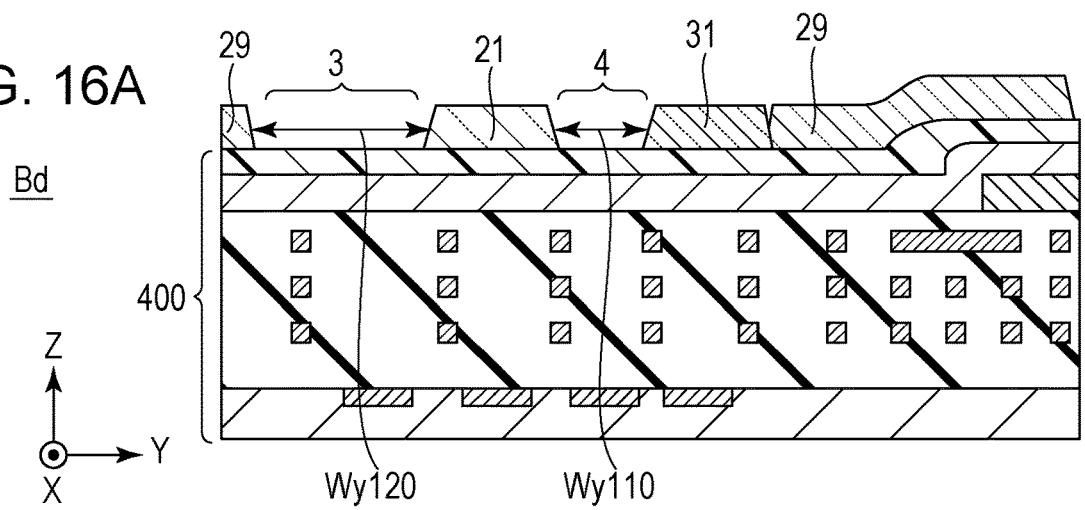
FIGS. 16A to 16C are schematic cross-sectional views of the MCFA illustrating the method for forming the MCFA according to the comparative embodiment.

FIGS. 15C and 16A illustrate the states of cross sections of individual steps included in the process B of forming the color filter array 20.

At step Bc illustrated in FIG. 15C, a color filter film 700 is formed on the base member 400 so as to cover the color filter array 30 using a coating method.

At step Bd illustrated in FIG. 16A, the color filter film 700 is patterned by photolithography (exposure and development). The color filter film 700 is exposed to light using an appropriate photomask. The exposed color filter film 700 is developed. The exposed part of the color filter film 700, which is a negative-type photosensitive resin, remains after the development. The part of the color filter film 700 remaining after the patterning forms the color filter array 20. At that time, a clearance 3 having a width Wy120 is formed between a color filter 21 in the color filter array 20 and a color filter 31 in the color filter array 30, and a clearance 4 having a width Wy110 is formed between the color filter 21 and a color filter 29. The width Wy110 of the clearance 4 is smaller than the width Wy120 of the clearance 3.

Figure 16B:
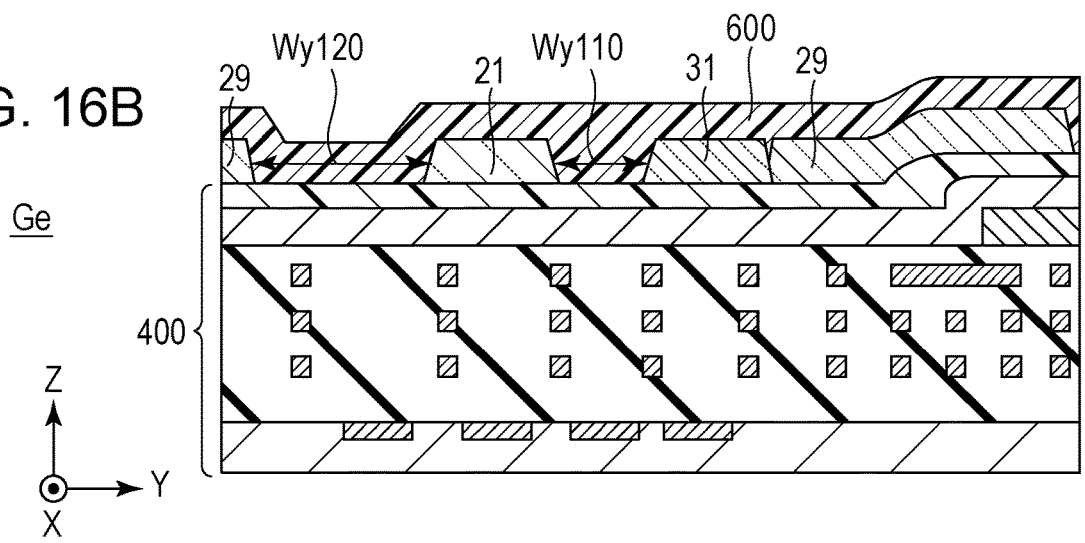
Figure 16C:
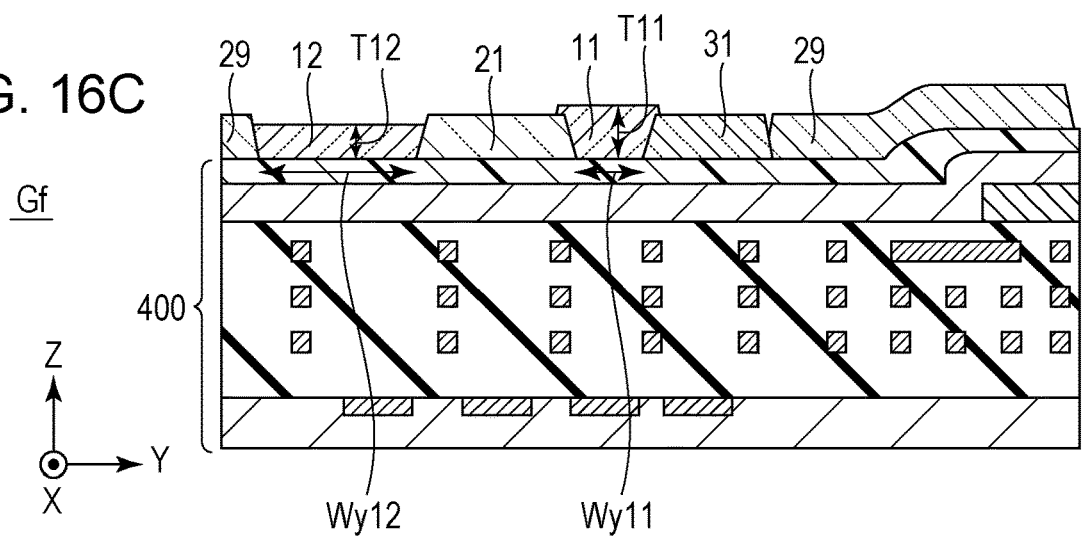

FIGS. 16B and 16C illustrate the states of cross sections of individual steps included in the process G of forming the color filter array 10.

At step Ge illustrated in FIG. 16B, a color filter film 700 is formed on the base member 400 so as to cover the color filter arrays 20 and 30 using a coating method. The color filter film 600 at that time is larger in the thickness in the clearance 4 between the color filter 21 and the color filter 31 than the thickness in the clearance 3 between the color filter 21 and the color filter 29. This is because forming a color filter film using a coating method tends to increase the thickness of the color filter film formed in the clearance as the clearance decreases in width.

At step Gf illustrated in FIG. 16C, the color filter film 600 is patterned by photolithography (exposure and development). The color filter film 600 is exposed to light using an appropriate photomask. The exposed color filter film 600 is developed. The exposed part of the color filter film 600, which is a negative-type photosensitive resin, remains after the development. The part of the color filter film 600 remaining after the patterning forms the color filter array 10. In detail, the color filter 11 having a width Wy11 is formed in the clearance 4 having the width Wy110, and the color filter 12 having a width Wy12 is formed in the clearance 3 having the width Wy120. As illustrated at step Ge, a difference in film thickness arises between the color filter film 600 in the clearance 3 and the color filter film 600 in the clearance 4. Therefore, the thickness T11 of the color filter 11 formed in the clearance 4 is larger than the thickness T12 of the color filter 12 formed in the clearance 3 (T12<T11).

Here, the case where the widths of the clearances 3 and 4 and the widths of the color filters 11 and 12 in the Y-direction differ has been described. The above also applies to a case where the widths of the clearances 3 and 4 and the widths of the color filters 11 and 12 in the X-direction differ.

In this comparative embodiment, the thickness of the color filter 15 (see FIG. 10A) tends to be larger than the thickness of the color filter 11. A cause of this is that the color filter 15 is positioned far from the color filter 12 than the color filter 11. Another cause is that the color filter 29 is positioned near to the color filter 15. In the above description, the thicknesses of the color filter 11 and the color filter 12 are compared. However, the comparative embodiment also tends to have a difference in thickness between the color filter 11 and the color filter 15r.

For that reason, adopting the forming method like the comparative embodiment tends to cause a difference in sensitivity between the pixels having the color filters of the color filter array 10. For that reason, it is advantageous to form the color filter array 10 prior to the other color filter arrays 20 and 30 in reducing color shading due to a difference in thickness between color filters.

Seventh Embodiment

In a seventh embodiment, the color filter arrays 10, 20, and 30 are shifted from the photoelectric conversion units 101, as illustrated in FIGS. 11A and 11B. As illustrated in FIG. 11A, the uppermost wiring layer 230 of the multilayer wiring is positioned directly below the boundaries between the color filters in the central portion of the image capturing device IS. In contrast, as illustrated in FIG. 11B, the wiring layer 230 is not positioned directly below the boundaries between the color filters in the peripheral portion of the image capturing device IS. Thus, the shape of the area of the color filter 11 overlapping with the wiring layer 230 differs from the shape of the area of the color filter 14 overlapping with the wiring layer 230. In that case, the widths of color filters of the same color can differ depending on whether exposure light is reflected by the wiring layer 230 or the intensity of the exposure light when the color filters of the same color are patterned. Line P in FIG. 17A indicates that the widths of the color filters are larger in the peripheral portion of the image capturing device IS than in the central portion.

FIGS. 18A and 18B, FIGS. 19A and 19B, and FIGS. 20A and 20B illustrate a method for forming the MCFA 50 according to the seventh embodiment.

Figure 18A:
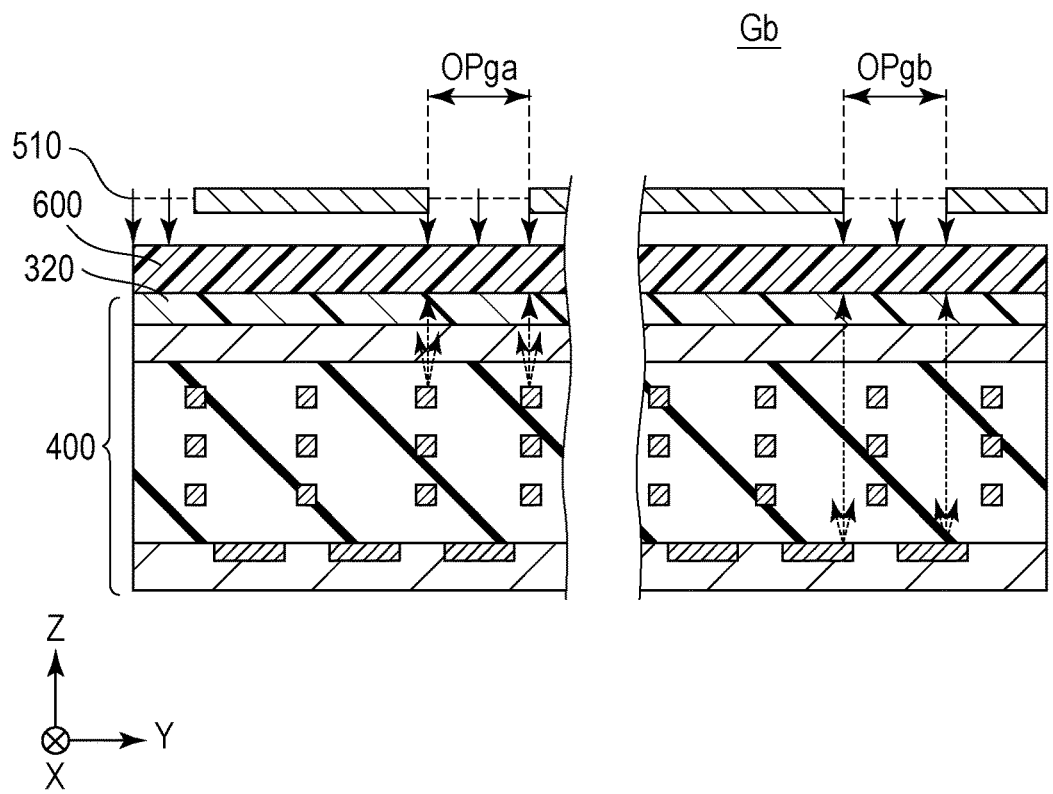
FIGS. 18A and 18B are schematic cross-sectional views of an MCFA illustrating a method for forming the MCFA according to the seventh embodiment of the present disclosure.
Figure 18B:
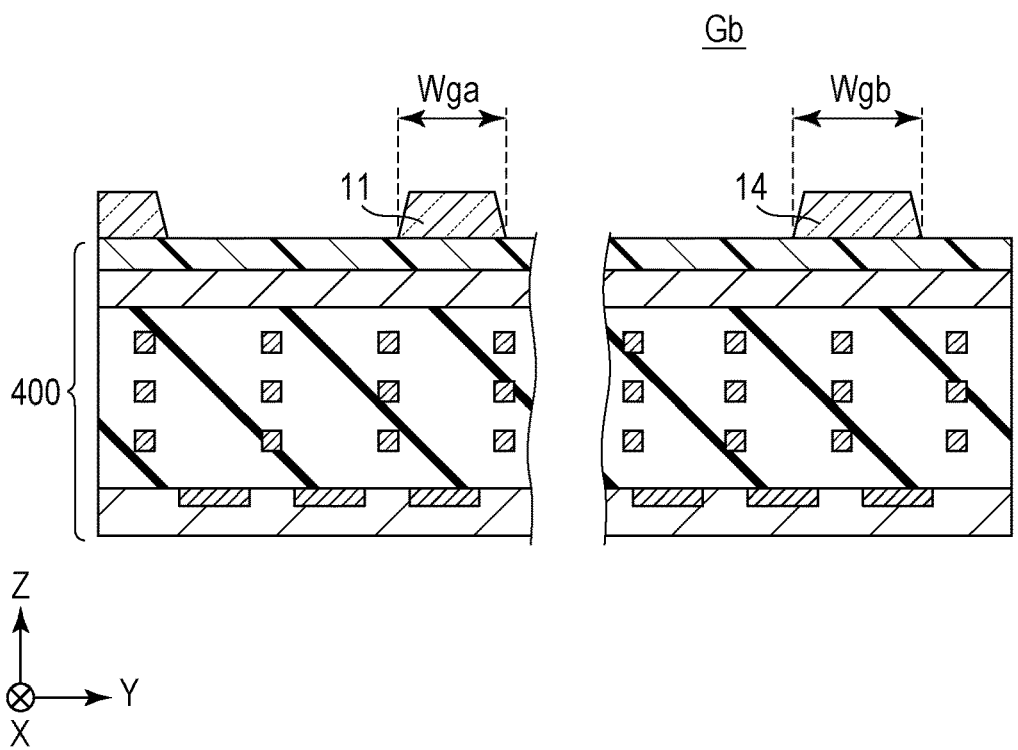

FIGS. 18A and 18B are detailed illustrative drawings of the step Gb illustrated in FIG. 13B. At the step in FIG. 18A, a color filter film 600, which is a negative-type photosensitive material, is applied, and then a latent image of a pattern on a photomask 510 is formed on the color filter film 600 by i-line exposure using the photomask 510. At the step in FIG. 18B, an unexposed portion is removed by developing the color filter film 600 to form the color filter array 10.

An opening of the photomask 510 for exposing a portion of the color filter film 600 to be the color filter 11 positioned in the central portion of the image capturing device IS has a width OPga. An opening of the photomask 510 for exposing a portion of the color filter film 600 to be the color filter 14 positioned in the peripheral portion of the image capturing device IS has a width OPgb. The color filter 11 has a width Wga corresponding to the width OPga, and the color filter 14 has a width Wgb corresponding to the width OPgb.

Figure 19A:
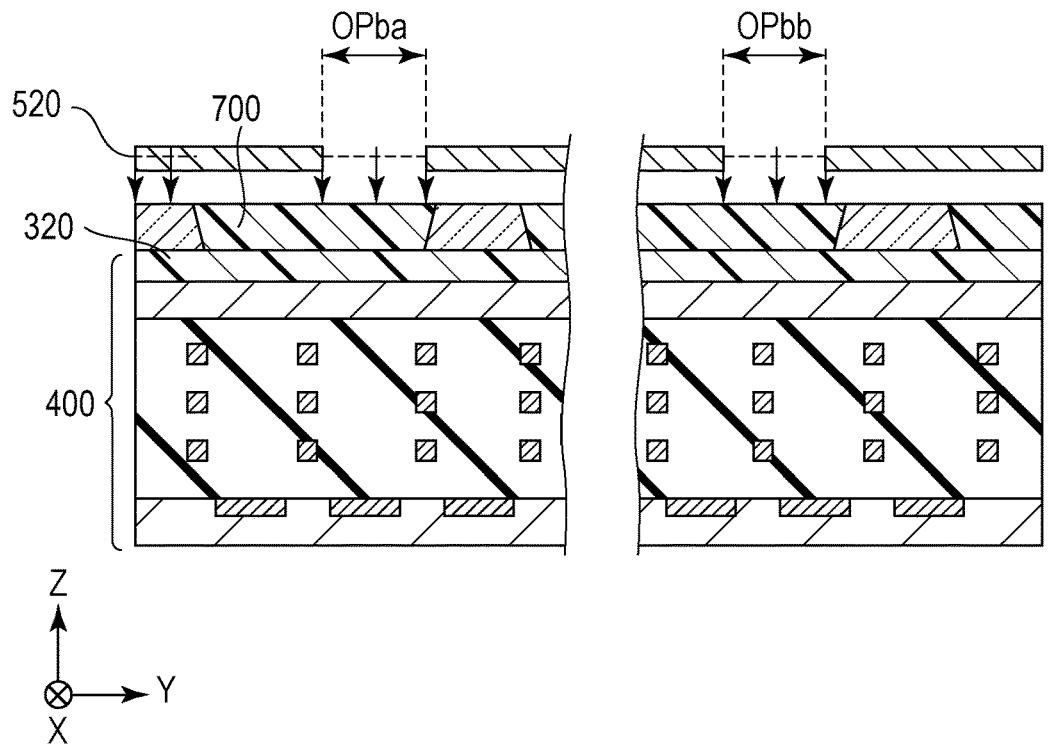
FIGS. 19A and 19B are schematic cross-sectional views of the MCFA illustrating the method for forming the MCFA according to the seventh embodiment.
Figure 19B:
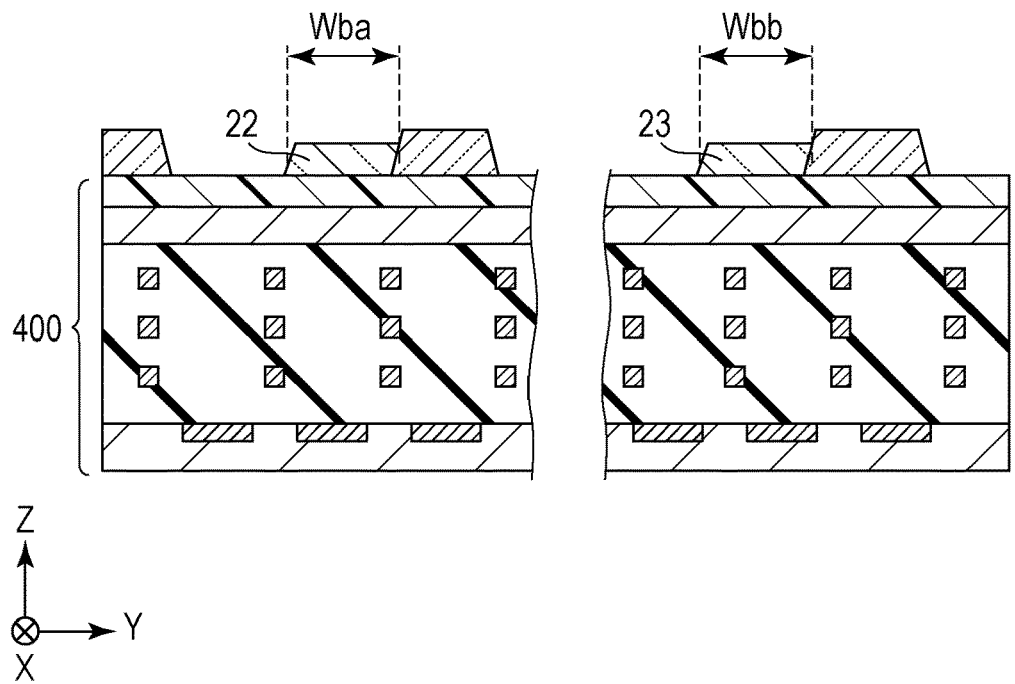

FIGS. 19A and 19B are detailed illustrative drawings of the step Bd illustrated in FIG. 14A. At the step in FIG. 19A, a color filter film 700, which is a negative-type photosensitive material, is applied, and then a latent image of a pattern on a photomask 520 is formed on the color filter film 700 by i-line exposure using the photomask 520. At the step in FIG. 19B, an unexposed portion is removed by developing the color filter film 700 to form the color filter array 20.

An opening of the photomask 520 for exposing a portion of the color filter film 700 to be the color filter 22 positioned in the central portion of the image capturing device IS has a width OPba. An opening of the photomask 520 for exposing a portion of the color filter film 700 to be the color filter 23 positioned in the peripheral portion of the image capturing device IS has a width OPbb. The color filter 22 has a width Wba corresponding to the width OPba, and the color filter 23 has a width Wbb corresponding to the width OPbb.

Figure 20A:
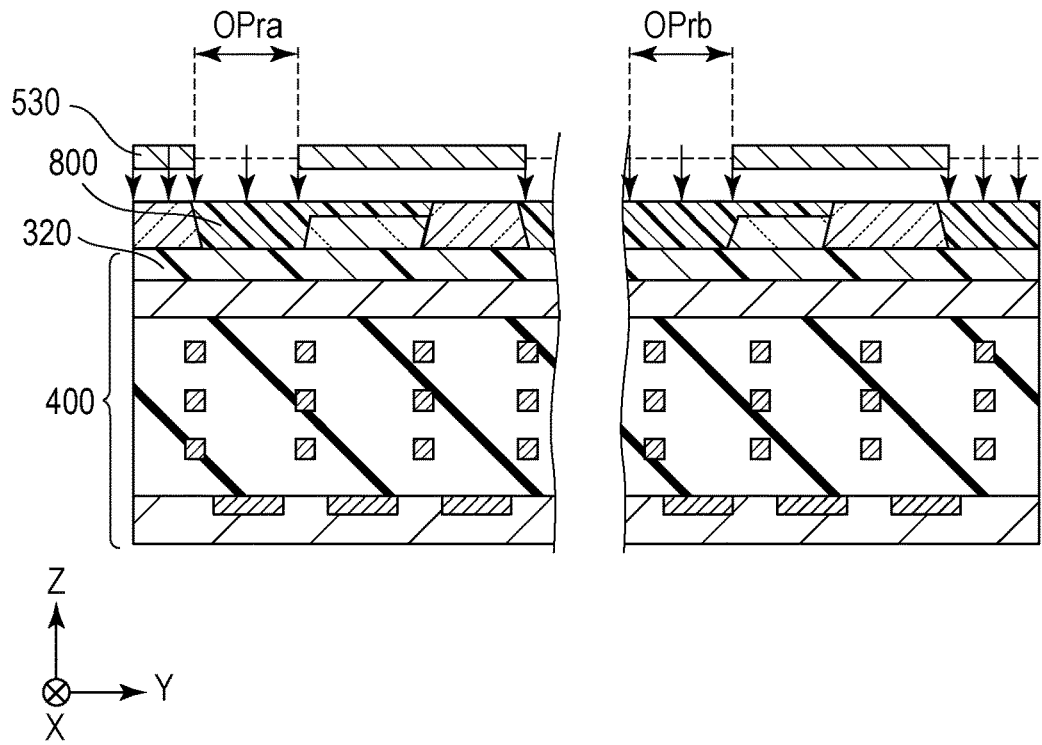
FIGS. 20A and 20B are schematic cross-sectional views of the MCFA illustrating the method for forming the MCFA according to the seventh embodiment.
Figure 20B:
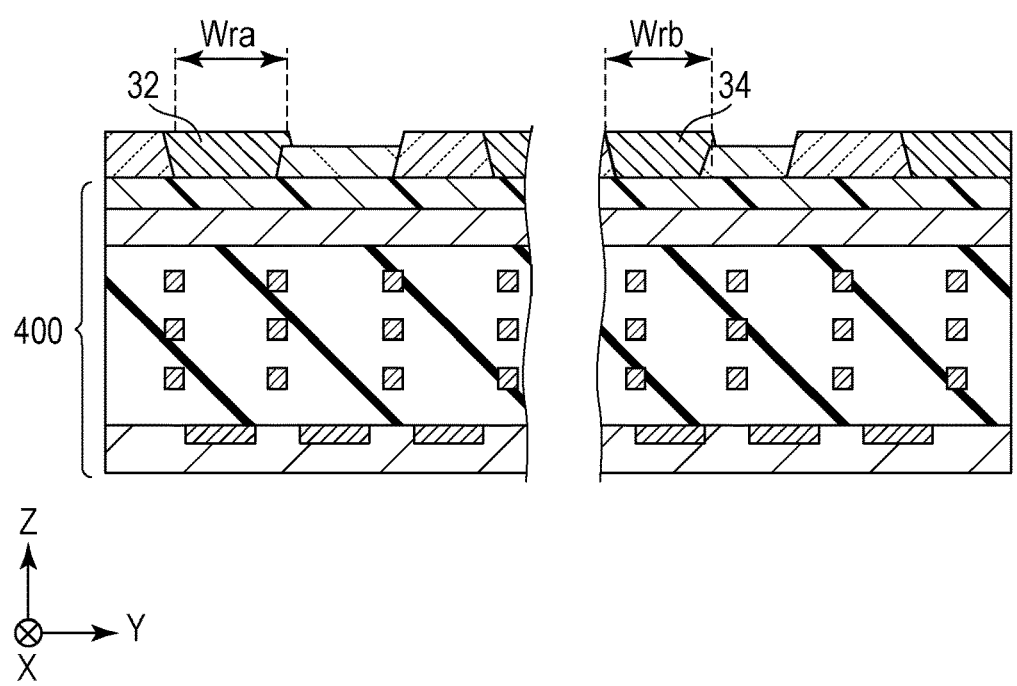

FIGS. 20A and 20B are detailed illustrative drawings of the step Rf illustrated in FIG. 14C. At the step in FIG. 20A, a color filter film 800, which is a negative-type photosensitive material, is applied, and then a latent image of a pattern on a photomask 530 is formed on the color filter film 800 by i-line exposure using the photomask 530. At the step in FIG. 20B, an unexposed portion is removed by developing the color filter film 800 to form the color filter array 30.

An opening of the photomask 530 for exposing a portion of the color filter film 800 to be the color filter 32 positioned in the central portion of the image capturing device IS has a width OPra. An opening of the photomask 530 for exposing a portion of the color filter film 800 to be the color filter 34 positioned in the peripheral portion of the image capturing device IS has a width OPrb. The color filter 32 has a width Wra corresponding to the width OPra, and the color filter 34 has a width Wrb corresponding to the width OPrb.

Figure 17A:
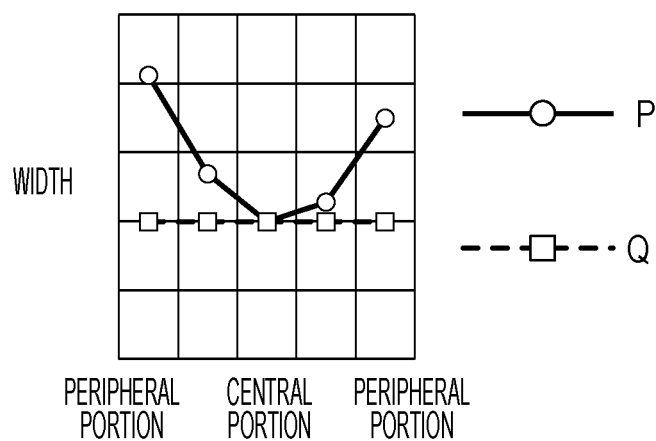
FIG. 17A is a graph for illustrating a method for forming MCFAs according to seventh to ninth embodiments of the present disclosure.
Figure 17B:
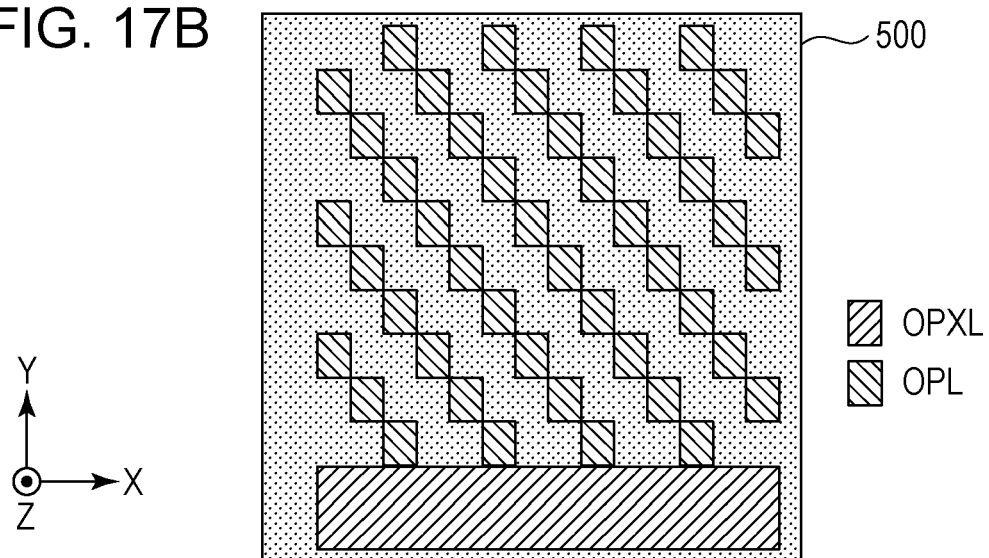
FIG. 17B is a schematic plan view of a photomask for illustrating a method for forming the MCFA according to the seventh embodiment.

A photomask 500 illustrated in FIG. 17B corresponds to the photomask 510 for forming the color filter array 10. An opening OPXL is an opening for forming the color filter 12 in the sixth embodiment. Openings OPL are openings for forming all color filters included in the color filter array 10 and excluding the color filter 12. As illustrated in FIG. 17B, the seventh embodiment uses the photomask 500 designed such that the openings other than the opening OPXL having a large opening width have he same width OPL. Therefore, the widths of the openings have the relations OPga=OPgb, OPba=OPbb, and OPra=OPrb. However, the widths of the color filters acquired by development have the relations, Wga<Wgb, Wba<Wbb, and Wra<Wrb. The relations, Wga<Wgb, Wba<Wbb, and Wra<Wrb, are within the range of Wdxb<Wdxg, Wdxr<Wdxg, Wdyb<Wdyg, and Wdyr<Wdyg, described in the sixth embodiment.

The following describes this. Although the photomask 500 in FIG. 17B is an example of application to the photomask 510, application to the photomask 520 or 530 is also possible.

As illustrated in FIG. 18A, reflection of exposure light is prevented in the central portion in which the wiring layer 230 is present below the boundary of the color filters by barrier metal that constitutes the upper surface of the wiring layer 230.

The wiring layer 230 is constructed such that titanium nitride (TiN) serving as barrier metal is disposed on aluminum, so that the upper surface of the wiring layer 230 is constituted of the barrier metal. The barrier metal absorbs ultraviolet rays (i-line), which is exposure light, so that reflection of the exposure light by the wiring layer 230 is reduced. For example, the i-line reflectance of titanium nitride is 20% to 30%, and the i-line reflectance of silicon is 50% to 70%. Therefore, halation at the exposure of the color filter film, which can be generated by reflection of the exposure light, is reduced in the central portion where the wiring layer 230 is present below the boundary of the color filters. In contrast, in the peripheral portion where the wiring layer 230 is not present (or with less wiring layer 230) below the boundary of the color filters, reflection of the exposure light using the barrier metal constituting the upper surface of the wiring layer 230 is not prevented (or the degree of antireflection decreases). For that reason, the exposure light is reflected by the surface of the semiconductor substrate 100, and the color filter film is excessively exposed to the reflected light at the end, causing halation. As a result, when the negative-type color filter film is developed, the width of the color filter increases in the peripheral portion where the degree of halation is large. If a positive-type photosensitive material is used as the color filter film, the width of the color filter decreases with a decreasing distance to the peripheral portion where the degree of halation is large. In contrast, in the case where the upper surface of the wiring layer 230 has higher reflectance of exposure light than the reflectance of the semiconductor substrate 100, the degree of halation increases with an decreasing distance to the central portion where the end of the color filter overlaps with the wiring layer 230. Thus, when the positional relationship between the wiring layer 230 and the end of the color filter differ between the central portion and the peripheral portion of the image capturing device IS, the widths of the color filters vary depending on how halation occurs. A color filter array including color filters having different widths is formed first, as described in the sixth embodiment. Therefore, even if the positional relationship between the color filter array 10 formed first and the wiring layer 230 differ in position in the image capturing device IS (the central portion and the peripheral portion), the MCFA 50 in which generation of color shading is reduced can be obtained.

Eighth Embodiment

Figure 17C:
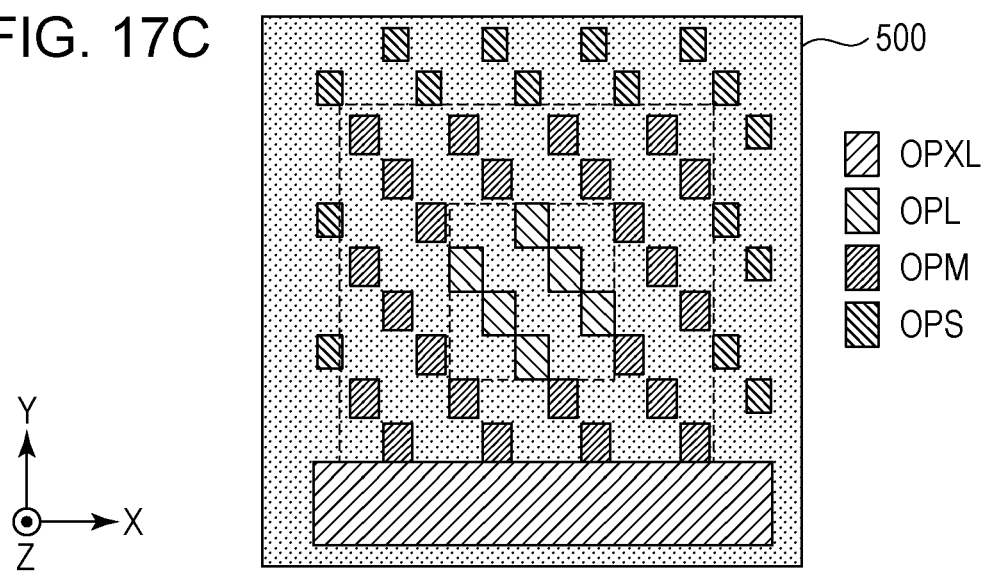
FIG. 17C is a schematic plan view of a photomask for illustrating a method for forming an MCFA according to an eighth embodiment of the present disclosure.

As illustrated in FIG. 17C, an eighth embodiment uses a photomask 500 designed such that the openings of the pattern other than the opening OPXL with a large opening width have a width OPL in the central portion, a width OPS in the peripheral portion, and a width OPM in an intermediate portion between the central portion and the peripheral portion. Therefore, the widths of the openings have the relations OPga>OPgb, OPba>OPbb, and OPra>OPrb. Thus, the photomask 500 includes an opening having the width OPga for exposing a portion to be the color filter 11 of the color filter film 600 and an opening having the width OPgb to form the color filter 14 of the color filter film 600. The width OPga and the width OPgb differ from each other in a direction in which the opening having the width OPga and the opening having the width OPgb are arranged (corresponding to the X-direction). This compensates for the influence of the halation and achieves the relationship between the widths of the color filters acquired by development, Wga=Wgb, Wba=Wbb, and Wra=Wrb, or relationships close thereto.

FIG. 17C is a schematic diagram of a photomask for forming a color filter array illustrating a state in which openings for forming the color filter array are disposed over the entire photomask. FIG. 17C illustrates a method for reducing variations in line width due to a difference in reflectance, illustrated in FIG. 17A. FIG. 17C illustrates correction for compensating changes in the size of the patterned color filter array from the openings on the photomask 500 corresponding to the color filter array over the entire surface of the photomask 500. The correction of the photomask 500 is performed according to an increase in line width so that the size of the color filter array during patterning becomes uniform. In FIG. 17C, the correction is performed so that the size of the color filter array on the photomask 510 decreases from the pixel center portion to the pixel peripheral portion. Although the correction is described in FIG. 17C using the photomask 510 as an example, this also applies to correction of the photomasks 520 and 530. Thus, adjusting the size of the array on the photomask 500 according to reflectance directly below the array reduces changes in the size of the array in the pixels, which come rise in an electronic device with a shrink structure.

Ninth Embodiment

In a ninth embodiment, the base member 400 can be configured to have a light-absorbing film between the wiring layer 230 and the color filter films 600, 700, and 800 in order to reduce the halation itself, described above. The light absorbing film is a film with an absorption rate of 10% or more for exposure light (for example, i-line) for use in patterning the color filter films 600, 700, and 800. In this embodiment, the planarizing film 320 is used as the light absorbing film. The i-line absorption rate of a general resin planarizing film is 2% to 3%. The exposure-light absorption rate is preferably 20% or more. However, extremely increasing the absorption rate of the light absorbing film at an exposure wavelength increases a visible-light absorption rate, possibly decreasing the sensitivity. For that reason, the exposure-light absorption rate may be 60% or less. Since exposure light that has passed through a light absorbing film is absorbed again by the light absorbing film even if it is reflected by the semiconductor substrate 100, an absorption rate of 20% or more gives a sufficient effect. Thus, disposing a light absorbing film with an absorption rate of 10% or more above the wiring layer 230 reduces differences in the degree of halation due to a difference in positional relationship between the wiring layer 230 and the color filter film.

The eighth embodiment and the ninth embodiment show that the difference in the widths of the color filters between the central portion and the peripheral portion of the image capturing device IS due to halation during exposure can be reduced, as indicated by line Q in FIG. 17A.

The above embodiments provide techniques useful in reducing color shading. The above embodiments can be modified as appropriate without departing from the spirit of the present disclosure. The first to ninth embodiments may also be combined as appropriate.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

What is claimed is:
1. A display device comprising:
a semiconductor substrate;
a light emitting layer disposed above the semiconductor substrate; and
color filter arrays disposed above the light emitting layer,
wherein the color filter arrays comprise a first color filter array constituted by color filters of a first color, and a second color filter array constituted by color filters of a second color which is different from the first color,
wherein each of the color filters of the first color contacts the color filter of the second color array,
wherein the first color filter array comprises a first pair of color filters adjacent to each other in a predetermined direction with a first clearance therebetween and a second pair of color filters adjacent to each other in the predetermined direction with a second clearance therebetween,
wherein the second color filter array comprises a first color filter positioned between the first pair of color filters and a second color filter positioned between the second pair of color filters,
wherein the first color filter and the second color filter transmit a part of visible wavelength light and do not transmit other visible wavelength light,
wherein a width of the first color filter in the predetermined direction is larger than a width of the second color filter in the predetermined direction, and wherein the second color filter partially overlaps with the second pair of color filters in a plain view with respect to the semiconductor substrate.

2. The display device according to claim 1, wherein the first color filter partially overlaps with the first pair of color filters in a plain view with respect to the semiconductor substrate.

3. The display device according to claim 1, wherein, in a direction perpendicular to the semiconductor substrate, a height of a farthest portion of the second color filter from the semiconductor substrate is different from a height of each farthest portion of two color filters constituting the second pair of color filters from the semiconductor substrate.

4. The display device according to claim 1, wherein, in a direction perpendicular to the semiconductor substrate, a height of a farthest portion of the first color filter from the semiconductor substrate is different from a height of each farthest portion of two color filters constituting the first pair of color filters from the semiconductor substrate.

5. The display device according to claim 1, further comprising,
a transistor disposed on the semiconductor substrate; and
a multilayer wiring structure disposed between the transistor and the light emitting layer.

6. The display device according to claim 1, wherein the second color filter is in contact with two color filters constituting the second pair of color filters.

7. The display device according to claim 6, further comprising,
a transistor disposed on the semiconductor substrate; and
a multilayer wiring structure disposed between the transistor and the light emitting layer.

8. The display device according to claim 6, wherein the second color filter is in contact with the two color filters constituting the second pair of color filters.

9. The display device according to claim 8, wherein the first color filter is in contact with the two color filters constituting the first pair of color filters.

10. The display device according to claim 6, wherein arrangement of the color filter arrays is a honeycomb type.

11. The display device according to claim 6, wherein arrangement of the color filter arrays is a Bayer type or a stripe type.

12. The display device according to claim 1, wherein the first color filter is in contact with two color filters constituting the first pair of color filters.

13. The display device according to claim 1, wherein arrangement of the color filter arrays is a honeycomb type.

14. The display device according to claim 1, wherein arrangement of the color filter arrays is a Bayer type or a stripe type.

15. A display system comprising:
a signal processing unit; and
a display device to which a signal processed by the signal processing unit is input,
wherein the display device is the display device according to claim 1.

16. A display system comprising:
an image capturing device; and
a display device for displaying an image captured by the image capturing device,
wherein the display device is the display device according to claim 1.

17. A display device comprising:
a semiconductor substrate;
a light emitting layer disposed above the semiconductor substrate,
color filter arrays disposed above the light emitting layer,
a transistor disposed on the semiconductor substrate; and
a multilayer wiring structure disposed between the transistor and the light emitting layer,
wherein the color filter arrays include a first color filter array constituted by color filters of a first color, and a second color filter array constituted by color filters of a second color which is different from the first color,
wherein each of the color filters of the first color contacts the color filter of the second color array,
wherein the first color filter array comprises a first pair of color filters adjacent to each other in a predetermined direction with a first clearance therebetween and a second pair of color filters adjacent to each other in the predetermined direction with a second clearance therebetween,
wherein the second color filter array comprises a first color filter positioned between the first pair of color filters and a second color filter positioned between the second pair of color filters,
wherein the first color filter and the second color filter transmit a part of visible wavelength light and do not transmit other visible wavelength light,
wherein a width of the first clearance in the predetermined direction is larger than a width of the second clearance in the predetermined direction, and
wherein a width of the first color filter in the predetermined direction is larger than a width of the second color filter in the predetermined direction.

18. The display device according to claim 17, wherein the second color filter is in contact with two color filters constituting the second pair of color filters.

19. The display device according to claim 18, wherein the first color filter is in contact with two color filters constituting the first pair of color filters.

20. The display device according to claim 17, wherein arrangement of the color filter arrays is a honeycomb type.

21. The display device according to claim 17, wherein arrangement of the color filter arrays is a Bayer type or a stripe type.

22. A display system comprising:
a signal processing unit; and
a display device to which a signal processed by the signal processing unit is input,
wherein the display device is the display device according to claim 17.

23. A display system comprising:
an image capturing device; and
a display device for displaying an image captured by the image capturing device,
wherein the display device is the display device according to claim 17.

* * * * *